(12) United States Patent
     Sadaka

(10) Patent No.: US 9,245,836 B2
(45) Date of Patent: Jan. 26, 2016

(54) INTERPOSERS INCLUDING FLUIDIC MICROCHANNELS AND RELATED STRUCTURES AND METHODS

(75) Inventor: Mariam Sadaka, Austin, TX (US)

(73) Assignee: Soitec, Bernin (FR)

( * ) Notice: Subject to any disclaimer, the term of this patent is extended or adjusted under 35 U.S.C. 154(b) by 222 days.

(21) Appl. No.: 13/536,061

(22) Filed: Jun. 28, 2012

(65) Prior Publication Data

US 2014/0001642 A1    Jan. 2, 2014

(51) Int. Cl.
    *H01L 23/48*     (2006.01)
    *H01L 23/498*    (2006.01)
    *H01L 23/473*    (2006.01)
    *H01L 23/367*    (2006.01)
    *H01L 23/00*     (2006.01)

(52) U.S. Cl.
    CPC ........ *H01L 23/49827* (2013.01); *H01L 23/367* (2013.01); *H01L 23/473* (2013.01); *H01L 23/49822* (2013.01); *H01L 24/14* (2013.01); *H01L 24/16* (2013.01); *H01L 2224/131* (2013.01); *H01L 2224/13011* (2013.01); *H01L 2224/13025* (2013.01); *H01L 2224/14051* (2013.01); *H01L 2224/14505* (2013.01); *H01L 2224/16145* (2013.01); *H01L 2224/16227* (2013.01); *H01L 2224/17519* (2013.01); *H01L 2224/73204* (2013.01); *H01L 2224/81191* (2013.01); *H01L 2224/81203* (2013.01); *H01L 2224/81815* (2013.01)

(58) Field of Classification Search
    CPC ................ B81B 2203/0338; H01L 23/473
    USPC ................. 257/618, E23.098, 714
    See application file for complete search history.

(56) References Cited

U.S. PATENT DOCUMENTS

| 6,219,237 B1 | 4/2001 | Geusic et al. |
| 6,242,778 B1 | 6/2001 | Marmillion et al. |
| 6,303,468 B1 | 10/2001 | Aspar et al. |
| 6,335,258 B1 | 1/2002 | Aspar et al. |
| 6,457,515 B1 | 10/2002 | Vafai et al. |
| 6,496,370 B2 * | 12/2002 | Geusic et al. ............... 361/699 |

(Continued)

OTHER PUBLICATIONS

Bakir et al., 3D Heterogeneous Integrated Systems: Liquid Cooling, Power Delivery, and Implementation, IEEE 2008 Custom Integrated Circuits Conference (CICC), Sep. 21-24, 2008, pp. 663-670.

(Continued)

*Primary Examiner* — Anthony Ho
(74) *Attorney, Agent, or Firm* — TraskBritt

(57) ABSTRACT

Interposers for use in the fabrication of electronic devices include semiconductor-on-insulator structures having fluidic microchannels therein. The interposers may include a multi-layer body in which a semiconductor material is bonded to a substrate with a layer of dielectric material between the semiconductor material and the substrate. At least one fluidic microchannel may extend in a lateral direction through at least one of the layer of dielectric material and the semiconductor material. The interposers may include redistribution layers and electrical contacts on opposing sides thereof. Semiconductor structures include one or more semiconductor devices coupled with such interposers. Such interposers and semiconductor structures may be formed by fabricating a semiconductor-on-insulator type structure using a direct bonding method and defining one or more fluidic microchannels at a bonding interface during the direct bonding process.

10 Claims, 19 Drawing Sheets

(56) References Cited

U.S. PATENT DOCUMENTS

| | | |
|---|---|---|
| 6,756,286 B1 | 6/2004 | Aspar et al. |
| 6,809,044 B1 | 10/2004 | Aspar et al. |
| 6,946,365 B2 | 9/2005 | Aspar et al. |
| 7,056,813 B2 | 6/2006 | Morrow et al. |
| RE39,484 E | 2/2007 | Bruel |
| 7,344,957 B2 | 3/2008 | Barna |
| 7,727,807 B2 | 6/2010 | Han |
| 7,882,624 B2 | 2/2011 | Hu et al. |
| 7,956,381 B1 | 6/2011 | Brewer et al. |
| 8,058,158 B2 | 11/2011 | Bourdelle et al. |
| 8,269,341 B2 | 9/2012 | Barth |
| 8,537,550 B2 | 9/2013 | Higuchi et al. |
| 8,563,365 B2 | 10/2013 | King, Jr. et al. |
| 2004/0251530 A1 | 12/2004 | Yamaji |
| 2005/0085018 A1 | 4/2005 | Kim et al. |
| 2005/0128702 A1 | 6/2005 | Mongia et al. |
| 2006/0002088 A1 | 1/2006 | Bezama et al. |
| 2006/0145356 A1 | 7/2006 | Liu et al. |
| 2007/0128827 A1 | 6/2007 | Faris |
| 2007/0145417 A1 | 6/2007 | Brar et al. |
| 2007/0190695 A1 | 8/2007 | Myers et al. |
| 2007/0267738 A1 | 11/2007 | Chung et al. |
| 2008/0150109 A1 | 6/2008 | Sunohara et al. |
| 2008/0196875 A1 | 8/2008 | Kurtz et al. |
| 2009/0322364 A1* | 12/2009 | Mangrum et al. ............ 324/755 |
| 2010/0038774 A1 | 2/2010 | Zhang et al. |
| 2010/0072961 A1* | 3/2010 | Kosonocky et al. .......... 323/281 |
| 2010/0127390 A1 | 5/2010 | Barth |
| 2010/0155888 A1* | 6/2010 | Christo et al. ................ 257/532 |
| 2010/0155932 A1 | 6/2010 | Gambino et al. |
| 2010/0157526 A1 | 6/2010 | Beaupre et al. |
| 2010/0187682 A1 | 7/2010 | Pinjala et al. |
| 2010/0187683 A1 | 7/2010 | Bakir et al. |
| 2010/0289113 A1 | 11/2010 | Bourdelle et al. |
| 2011/0045611 A1 | 2/2011 | Castex et al. |
| 2011/0170266 A1 | 7/2011 | Haensch et al. |
| 2012/0013012 A1 | 1/2012 | Sadaka et al. |
| 2012/0013013 A1 | 1/2012 | Sadaka et al. |
| 2012/0306088 A1 | 12/2012 | Bartley et al. |
| 2014/0027895 A1 | 1/2014 | Mizuno et al. |
| 2014/0147972 A1* | 5/2014 | Semmelmeyer et al. ..... 438/109 |

OTHER PUBLICATIONS

Dang, Bing, Integrated Input/Output Interconnection and Packaging for GSI, Georgia Institute of Technology, Dec. 2006, 231 pages.

Sekar et al., A 3D-IC Technology with Integrated Microchannel Cooling, Interconnect Technology Conference, 2008, pp. 13-15.

French Preliminary Search Report and Opinion for French Application No. 1256683 dated Mar. 21, 2013, 7 pages.

Wei et al., Optimization Study of Stacked Micro-Channel Heat Sinks for Micro-Electronic Cooling, IEEE Transactions on Components and Packaging Technologies, Mar. 2003, pp. 55-61, vol. 26, No. 1.

* cited by examiner

INTERPOSERS INCLUDING FLUIDIC MICROCHANNELS AND RELATED STRUCTURES AND METHODS

CROSS-REFERENCE TO RELATED APPLICATION

The subject matter of this application is related to the subject matter of U.S. patent application Ser. No. 13/536,034, filed Jun. 28, 2012, now U.S. Pat. No. 8,980,688, issued Mar. 17, 2015, the disclosure of which is incorporated herein in its entirety by this reference.

TECHNICAL FIELD

The present disclosure relates to methods of forming semiconductor structures that include fluidic microchannels in an interposer for fluid flow, and to interposers and semiconductor structures and devices fabricated using such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou, et al. "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

As semiconductor structures are integrated in a 3D configuration, however, the removal of heat from the integrated structures becomes problematic. The density of heat generating devices may be increased in 3D integration processes, without a proportional increase in heat-dissipating outer surface area. The additional heat generated needs to be removed from the 3D integrated structures to prevent failure of the operational devices therein resulting from excessive temperatures.

It has been proposed to incorporate fluid channels having microscale dimensions or smaller (hereinafter referred to as "fluidic microchannels") into 3D integrated semiconductor structures to allow fluid to flow through the fluidic microchannels during operation of the devices in the 3D integrated semiconductor structures for removal of heat. See, for example, D. Sekar, "A 3D-IC Technology with Integrated Microchannel Cooling," IEEE 2008, (Georgia Tech).

BRIEF SUMMARY

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, the present disclosure includes interposers that comprise semiconductor-on-insulator structures having fluidic microchannels therein. The interposers may include a multi-layer body in which a semiconductor material is bonded to a substrate with a layer of dielectric material between the semiconductor material and the substrate. At least one fluidic microchannel may extend in a lateral direction through at least one of the layer of dielectric material and the semiconductor material. At least one redistribution layer may be disposed on the multi-layer body. The redistribution layer may include at least one conductive feature, such as a laterally extending conductive trace. The interposer further includes at least one vertically oriented electrically conductive via that extends at least partially through the multi-layer body. At least one electrical contact may be disposed on a first major surface of the interposer, and at least one electrical contact may be disposed on a second major surface of the interposer on a side thereof opposite the first major surface. The at least one conductive feature of the redistribution layer (e.g., the at least one laterally extending conductive trace) and the at least one vertically oriented electrically conductive via at least partially define an electrical pathway extending through the interposer from the at least one electrical contact on the first major surface of the interposer to the at least one electrical contact on the second major surface of the interposer.

In additional embodiments, the present disclosure includes semiconductor structures that include an interposer, and at least one semiconductor device structurally bonded to the interposer. The interposer may comprise a multi-layer body including a semiconductor material bonded to a substrate with a layer of dielectric material between the semiconductor material and the substrate. At least one fluidic microchannel extends in a lateral direction through at least one of the layer of dielectric material and the semiconductor material. The interposer may include at least one redistribution layer on the multi-layer body, and the redistribution layer may include at least one conductive feature, such as a laterally extending conductive trace. At least one vertically oriented electrically conductive via may extend at least partially through the multi-layer body. At least one electrical contact may be disposed on a first major surface of the interposer, and at least one electrical contact may be disposed on a second major surface of the interposer on a side thereof opposite the first major surface. The at least one conductive feature of the redistribution layer and the at least one vertically oriented electrically conductive via at least partially define an electrical pathway extending through the interposer from the at least one electrical contact on the first major surface of the interposer to the at least one electrical contact on the second major surface of the interposer. The semiconductor device bonded to the interposer may include at least one conductive structure structurally and electrically coupled with the at least one electrical contact on the first major surface of the interposer or the at least one electrical contact on the second major surface of the interposer.

In additional embodiments, the present disclosure includes methods of forming such interposers and semiconductor structures including such interposers. For example, in some embodiments, a multi-layer body may be formed by forming at least one laterally extending recess in at least one of a first dielectric material on a substrate and a second dielectric material on a semiconductor material, and bonding the semiconductor material to the substrate. The semiconductor material may be bonded to the substrate by establishing dielectric-to-dielectric atomic bonds directly between the first dielectric material on the substrate and the second dielectric material on the semiconductor material. At least one fluidic microchannel may be defined between the first dielectric material and the second dielectric material at an interface between the first dielectric material and the second dielectric material. At least one vertically oriented electrically conductive via may be formed that extends at least partially through the multi-layer body. At least one redistribution layer may be provided on the multi-layer body. The redistribution layer includes at least one conductive feature, such as a laterally extending conductive trace. At least one electrical contact may be provided on a first major surface of the interposer, and at least one electrical contact may be provided on a second major surface of the interposer on a side thereof opposite the first major surface. An electrical pathway is formed that extends through the interposer from the at least one electrical contact on the first major surface of the interposer to the at least one electrical contact on the second major surface of the interposer. At least a portion of the electrical pathway extends through the at least one vertically oriented electrically conductive via and through the at least one conductive feature of the redistribution layer.

BRIEF DESCRIPTION OF THE DRAWINGS

While the specification concludes with claims particularly pointing out and distinctly claiming what are regarded as embodiments of the invention, the advantages of embodiments of the disclosure may be more readily ascertained from the description of certain examples of embodiments of the disclosure when read in conjunction with the accompanying drawings, in which:

FIG. 5 is a simplified cross-sectional view illustrating a donor structure comprising bulk semiconductor material;

FIG. 6 illustrates a dielectric material on a surface of the donor structure of FIG. 5;

FIG. 7 illustrates the dielectric material on the surface of the donor structure abutting the dielectric material of the structure of FIG. 3;

FIG. 8 illustrates the dielectric material between the donor structure and the substrate of the structure of FIG. 3 after a bonding process used to establish a direct molecular bond between the dielectric material on the surface of the donor structure and the dielectric material of the structure of FIG. 3;

FIG. 9 is a simplified cross-sectional view illustrating a dielectric material on a surface of a donor structure with laterally extending recesses formed in the dielectric material;

FIG. 10 illustrates the dielectric material on the surface of the donor structure as shown in FIG. 9 abutting the dielectric material of the structure of FIG. 3;

FIG. 11 is a simplified cross-sectional view like that of FIG. 4 and illustrates a layer of semiconductor material bonded over a substrate with dielectric material between the layer of semiconductor material and the substrate, and fluidic microchannels extending through the dielectric material;

FIG. 12 illustrates apertures formed through the layer of semiconductor material;

FIG. 13 illustrates a dielectric material provided over the layer of semiconductor material and within the recesses formed in the layer of semiconductor material;

FIG. 14 illustrates another semiconductor structure that may be used in an interposer and that includes another layer of semiconductor material bonded over the structure of FIG. 13 in a manner forming fluidic microchannels extending through a dielectric material between the additional layer of semiconductor material and the first layer of semiconductor material, the fluidic microchannels at least partially disposed within the apertures formed through the first layer of semiconductor material;

FIG. 15 illustrates another semiconductor structure, which also may be used in an interposer, and that may be fabricated by repeating the processes described with reference to FIGS. 12 through 14 on the structure of FIG. 14 two additional times to form two additional layers of fluidic microchannels over the structure of FIG. 14;

FIG. 16 is a simplified cross-sectional view of a layer of semiconductor material bonded over a substrate with a solid and continuous layer of dielectric material between the layer of semiconductor material and the substrate;

FIG. 17 illustrates apertures formed through the layer of semiconductor material of FIG. 16;

FIG. 18 illustrates a dielectric material provided on the layer of semiconductor material and within the apertures formed therein;

FIG. 19 illustrates another semiconductor structure that may be used in an interposer and that includes another layer of semiconductor material bonded over the structure of FIG. 18 in a manner forming fluidic microchannels extending through a dielectric material between the additional layer of semiconductor material and the first layer of semiconductor material, the fluidic microchannels at least partially disposed within the apertures formed through the first layer of semiconductor material;

FIG. 20 illustrates another semiconductor structure, which also may be used in an interposer, and that may be fabricated by repeating the processes described with reference to FIGS. 17 through 19 on the structure of FIG. 19 two additional times to form two additional layers of fluidic microchannels over the structure of FIG. 19;

FIG. 22 is a simplified cross-sectional view illustrating a dielectric material over a substrate with apertures formed through the dielectric material and holes for conductive vias formed through the dielectric material and partially through the substrate;

FIG. 23 illustrates laterally extending recesses for forming fluidic microchannels formed in the layer of dielectric material of the structure of FIG. 22;

FIG. 24 illustrates dielectric material provided over the structure of FIG. 24 including within the recesses and the holes;

FIG. 25 illustrates a donor structure bonded to the structure of FIG. 24;

FIG. 26 illustrates a layer of semiconductor material bonded over the substrate and transferred from the donor structure shown in FIG. 25;

FIG. 27 illustrates holes formed through the transferred layer of semiconductor material so as to extend the holes extending through the dielectric material and the substrate through the layer of semiconductor material;

FIG. 28 illustrates an electrically conductive material within the holes extending through the structure of FIG. 27;

FIG. 29 is a simplified cross-sectional view illustrating a dielectric material over a substrate with conductive vias formed through the dielectric material and partially through the substrate;

FIG. 30 illustrates recesses for forming fluidic microchannels formed through the dielectric material of the structure of FIG. 29;

FIG. 31 illustrates dielectric material provided over the structure of FIG. 30 including within the apertures;

FIG. 32 illustrates a donor structure bonded to the structure of FIG. 31;

FIG. 33 illustrates a layer of semiconductor material bonded over the substrate and transferred from the donor structure shown in FIG. 32;

FIG. 34 illustrates holes formed through the transferred layer of semiconductor material over the conductive vias extending through the dielectric material and partially through the substrate;

FIG. 35 illustrates additional electrically conductive material within the holes extending through the layer of semiconductor material in the structure of FIG. 34 so as to extend the conductive vias through the layer of semiconductor material;

DETAILED DESCRIPTION

The illustrations presented herein are not meant to be actual views of any particular semiconductor material, structure, or device, but are merely idealized representations that are used to describe embodiments of the disclosure.

Any headings used herein should not be considered to limit the scope of embodiments of the invention as defined by the claims below and their legal equivalents. Concepts described in any specific heading are generally applicable in other sections throughout the entire specification.

A number of references are cited herein, the entire disclosures of which are incorporated herein in their entirety by this reference for all purposes. Further, none of the cited references, regardless of how characterized herein, is admitted as prior art relative to the invention of the subject matter claimed herein.

The present disclosure includes methods of fabricating semiconductor structures that include one or more fluidic microchannels for use in cooling active semiconductor devices carried by or bonded to the semiconductor structures. The structures may be configured and used as an interposer. As used herein, the term "interposer" means and includes any semiconductor structure that is configured to be disposed between, and structurally and electrically coupled to each of, two different structures or devices. Interposers may be configured to redistribute a first pattern of electrical contacts on a first side of the interposer to a different, second pattern of electrical contacts on an opposing second side of the interposer. The methods described herein for forming interposers may employ what are referred to in the art as "semiconductor-on-insulator" (SOI) structures. Such methods are disclosed below with reference to the figures.

Figure 1:
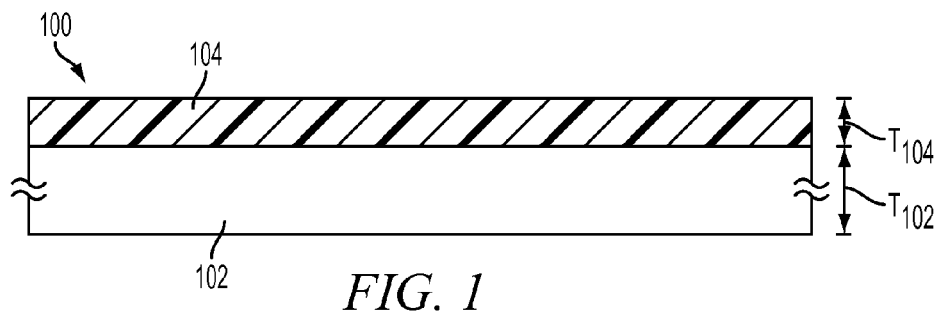
FIG. 1 is a simplified cross-sectional view illustrating a dielectric material on a substrate.

FIG. 1 illustrates a structure 100 that includes a substrate 102 and a dielectric material 104 on the substrate. The substrate 102 may comprise what is referred to in the art as a "die" or a "wafer," and may be generally planar. The substrate 102 may comprise any of a number of materials conventionally used for such substrates, such as oxides (e.g., aluminum oxide, zirconium oxide, silicon oxide, etc.) and semiconductor materials (e.g., silicon, germanium, silicon carbide, a III-V semiconductor material, aluminum nitride, diamond, etc.). The substrate 102 may comprise a glass in some embodiments. In other embodiments, the substrate 102 may comprise a crystalline material (e.g., polycrystalline or monocrystalline material). Further, the substrate 102 may be at least substantially comprised by a single, generally homogeneous material, or the substrate 102 may comprise a multi-layer structure. The dielectric material 104 may comprise an electrically insulating material, such as an oxide (e.g., silicon oxide, aluminum oxide, zirconium oxide, etc.), a nitride (e.g., silicon nitride), or an oxynitride (e.g., silicon oxynitride). The dielectric material 104 may comprise a layer of the dielectric material 104 that is disposed on a major, planar surface of the generally planar substrate 102, as shown in FIG. 1.

The figures are not to scale, and the layer of dielectric material 104 may be relatively thin when compared to a thickness of the substrate 102. By way of example and not limitation, the substrate 102 may have an average layer thickness $T_{102}$ of about two hundred microns (200 μm) or more, about five hundred microns (500 μm) or more, or even about seven hundred fifty microns (750 μm) or more, whereas the layer of dielectric material 104 may have an average layer thickness $T_{104}$ of about five hundred microns (500 μm) or less, or even about four hundred microns (400 μm) or less (e.g., between about one tenth of one micron (0.1 μm) and about five hundred microns (500 μm), or even between about two hundred microns (200 μm) and about four hundred (400 μm) microns).

Figure 2A:
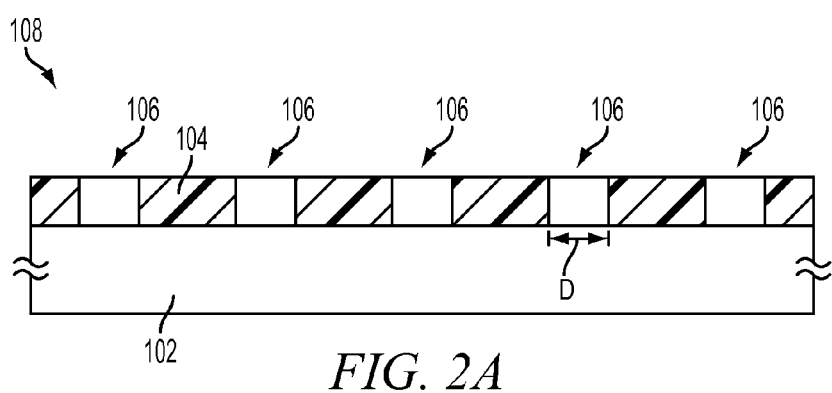
FIG. 2A illustrates apertures formed through the dielectric material of FIG. 1.
Figure 2B:
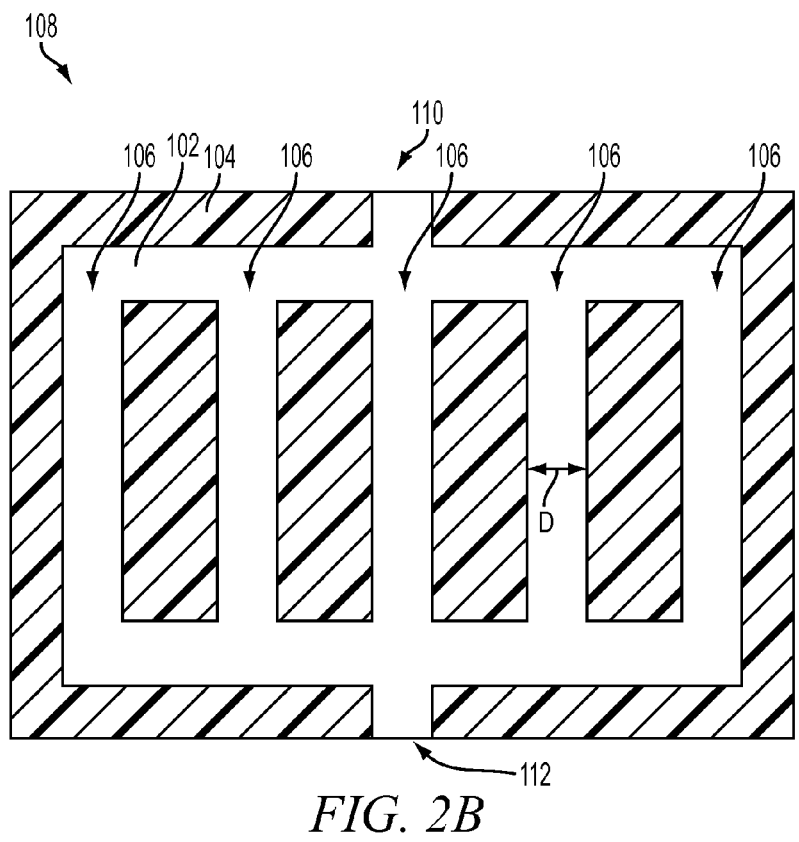
FIG. 2B is a plan view of the semiconductor structure of FIG. 2A.

Referring to FIGS. 2A and 2B, one or more laterally extending recesses 106 may be formed in the dielectric material 104 on the substrate 102 to form the semiconductor structure 108 shown therein. The recesses 106 are used to form fluidic microchannels. The laterally extending recesses 106 may comprise apertures that extend entirely through the dielectric material 104 to the underlying substrate 102 in some embodiments. In other embodiments, the recesses 106 may extend only partially through the dielectric material 104. The recesses 106 may have an average transverse cross-sectional dimension D of between about one tenth of a micron (0.1 μm) and about seven hundred microns (700 μm), between about ten microns (10 μm) and about five hundred microns (500 μm), or between about one hundred microns (100 μm) and about four hundred microns (400 μm).

The recesses 106 may be interconnected with one another so as to form an interconnected network of recesses, which may communicate with a fluid inlet port 110 and a fluid outlet port 112 (FIG. 2B) on lateral sides of the semiconductor structure. In this configuration, upon completion of fabrication of the semiconductor structure, a cooling fluid (e.g., a gas, a liquid, or both a gas and a liquid) may be caused to flow into the semiconductor structure through the inlet port 110, through fluidic microchannels comprising the recesses 106, and out the outlet port 112 to remove heat from the semiconductor structure. Other configurations and layouts for the recesses 106 and resulting fluidic microchannels may be employed, and the configuration shown in FIGS. 2A and 2B is provided merely as a non-limiting example. Further, although the embodiment of FIGS. 2A and 2B includes only a single fluid inlet port 110 and a single fluid outlet port 112, other embodiments may include two or more inlet ports 110 and two or more outlet ports 112. The configuration of the recesses 106 and resulting fluidic microchannels (including their layout design and size) may be selected to optimize mass transport of a cooling fluid during operation, and, hence, heat exchange between the cooling fluid and the semiconductor structure.

The recesses 106 may be formed in the dielectric material 104 using, for example, a photolithographic masking and etching process. In such embodiments, a mask layer may be deposited over the surface of the dielectric material 104 and selectively patterned so as to form apertures through the mask layer at the locations at which it is desired to etch into the dielectric material to form the recesses 106. After forming the patterned mask layer, the regions of the dielectric material 104 that are exposed through the patterned mask layer may be etched using, for example, a wet etching process or a dry reactive ion etching process to form the recesses 106 in the dielectric material 104. Although the recesses 106 are shown in FIGS. 2A and 2B as having a rectangular cross-sectional shape, the recesses 106 may have any cross-sectional shape, and the cross-sectional shape may be at least partially a function of the type of etching process (e.g., isotropic or anisotropic) used to form the recesses 106. After the etching process, the patterned mask layer may be removed.

Figure 3:
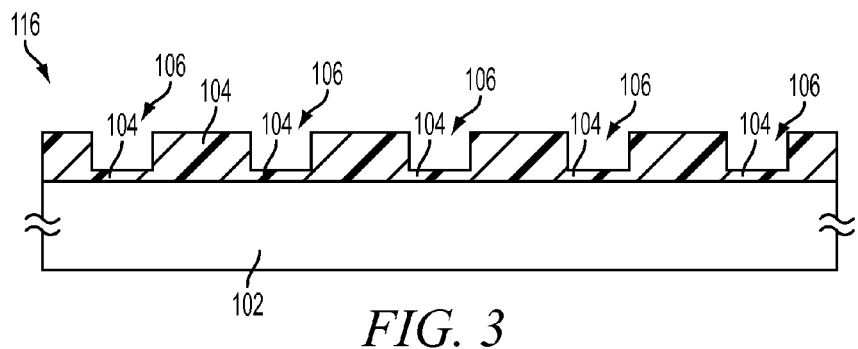
FIG. 3 illustrates additional dielectric material provided on the structure of FIG. 2A.

Referring to FIG. 3, additional dielectric material 104 optionally may be provided over the semiconductor structure 108 of FIGS. 2A and 2B, including within the recesses 106 so as to cover any exposed surface of the substrate 102 within the recesses 106 with dielectric material 104 and form the structure 116 of FIG. 3. In other words, the recesses 106 may be lined with dielectric material 104. This may prevent oxidation or other alteration of the surfaces within the recesses 106 and resulting fluidic microchannels when cooling fluid is caused to flow through the fluidic microchannels during operation. In some embodiments, the additional dielectric material 104 may be similar or identical in composition to the dielectric material 104 first provided on the substrate 102. The additional dielectric material 104 may be formed, in some embodiments, by oxidizing exposed surfaces of the substrate 102 using a thermal oxidation process (e.g., heating the structure in the presence of oxygen). For example, if the substrate 102 comprises silicon, the exposed surfaces of the substrate 102 may be oxidized to form silicon oxide. In other embodiments, the additional dielectric material 104 may be deposited using, for example, a chemical vapor deposition (CVD) process. As previously mentioned, in additional embodiments, the structure 116 of FIG. 3 may be formed by selectively etching entirely through the material 104 and stopping on the substrate 102, or by etching only partially through the dielectric material 104 when forming the recesses 106, so as to avoid exposing the underlying surface of the substrate 102, thereby avoiding any potential need to deposit additional dielectric material 104 as described with reference to FIG. 3.

Figure 4:
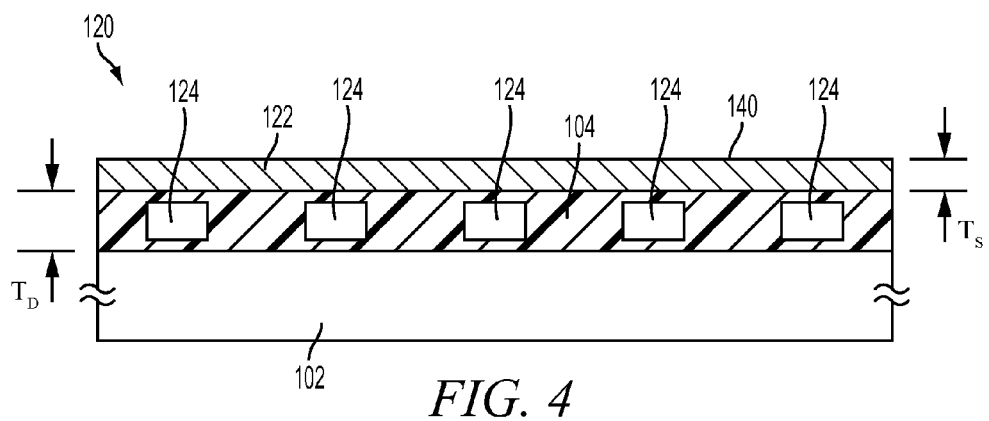
FIG. 4 illustrates a semiconductor structure that may be used in an interposer and that includes a layer of semiconductor material bonded over the structure of FIG. 3 with dielectric material between the layer of semiconductor material and the substrate, and further includes fluidic microchannels extending through the dielectric material.

FIG. 4 illustrates a semiconductor structure 120 that may be formed by bonding a semiconductor material 122 to the substrate 102 of the structure 116 of FIG. 3 by establishing direct dielectric-to-dielectric atomic bonds directly between the dielectric material 104 on the substrate 102 and a dielectric material 104 on the semiconductor material 122 as described herein below. As shown in FIG. 4, a plurality of fluidic microchannels 124 are defined between the dielectric material 104 on the substrate 102 and the dielectric material 104 on the semiconductor material 122 at the interface therebetween. As shown in FIG. 4, the fluidic microchannels 124 are at least partially defined by the recesses 106 previously formed in the dielectric material 104 on the substrate 102. Further, the fluidic microchannels 124 have cross-sectional shapes shown in FIG. 4 that are entirely surrounded by the dielectric material 104 between the semiconductor material 122 and the substrate 102.

The semiconductor structure 120 shown in FIG. 4 may comprise a semiconductor-on-insulator structure, and may include a layer of semiconductor material 122 bonded over the substrate 102 with an electrically insulating dielectric material 104 between the layer of semiconductor material 122 and the substrate 102. In some embodiments, the layer of semiconductor material 122 and/or the layer of dielectric material 104 may be relatively thin compared to a thickness of the substrate 102. In embodiments in which the semiconductor material 122 comprises silicon, the semiconductor structure 120 shown in FIG. 4 may comprise what is referred to in the art as a silicon-on-insulator structure. The layer of semiconductor material 122 may have an average layer thickness $T_S$ of between about five nanometers (5 nm) and about two and one-half microns (2.5 μm), between about ten nanometers (10 nm) and about one and one-half microns (1.5 μm), or even between about twenty nanometers (20 nm) and about one hundred nanometers (100 nm). The layer of electrically insulating dielectric material 104 may have an average layer thickness $T_D$, which may be relatively thicker than such layers in conventional SOI structures to accommodate the presence of the fluidic microchannels 124 therein. As non-limiting examples, the relatively thin layer of electrically insulating dielectric material 104 may have an average layer thickness $T_D$ of between about one tenth of one micron (0.1 µm) and about five hundred microns (500 µm), between about one micron (1.0 µm) and about four hundred microns (400 µm), or even between about one hundred microns (100 µm) and about four hundred microns (400 µm). In further embodiments, the layer of electrically insulating dielectric material 104 may have an average layer thickness $T_D$ of about five hundred microns (500 µm) or more, or even about nine hundred microns (900 µm) or more.

The layer of semiconductor material 122 may be provided over the substrate 102 by bonding a separately formed layer of semiconductor material 122 to the dielectric material 104 on the major surface of the substrate 102. In some embodiments, a layer of semiconductor material 122 may be bonded to the substrate 102 by transferring a layer of semiconductor material 122 from a donor structure onto the structure 116 of FIG. 3. By way of example and not limitation, the process known in the art as the SMARTCUT® process may be used to transfer a layer of semiconductor material 122 from a donor structure onto the structure 116 of FIG. 3.

The SMARTCUT® process is described in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Figure 5:
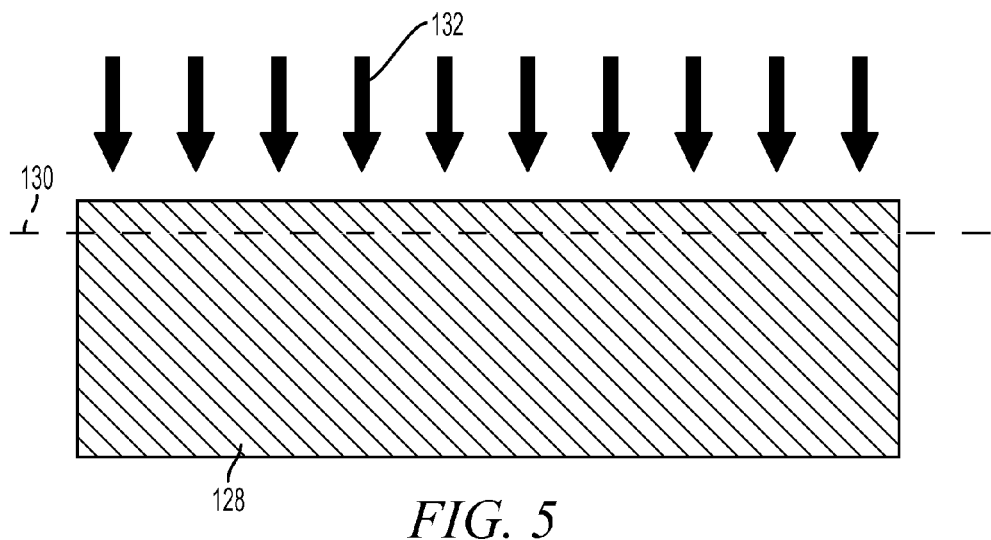
FIGS. 5 through 8 illustrate a method that may be used to provide the layer of semiconductor material shown in FIG. 4 over the structure of FIG. 3.

The SMARTCUT® process is briefly described below with reference to FIGS. 5 through 8. Referring to FIG. 5, a plurality of ions (e.g., one or more of hydrogen, helium, or inert gas ions) may be implanted into a donor structure 128 along an ion implant plane 130. The donor structure 128 may comprise a bulk crystalline semiconductor material, such as monocrystalline silicon. The implantation of ions is represented in FIG. 5 by directional arrows 132. The implanted ions along the ion implant plane 130 define a weakened zone or plane within the donor structure 128, along which the donor structure 128 subsequently may be cleaved or otherwise fractured. As known in the art, the depth at which the ions are implanted into the donor structure 128 is at least partially a function of the energy with which the ions are implanted into the donor structure 128. Generally, ions implanted with less energy will be implanted at relatively shallower depths, while ions implanted with higher energy will be implanted at relatively deeper depths.

Figure 6:
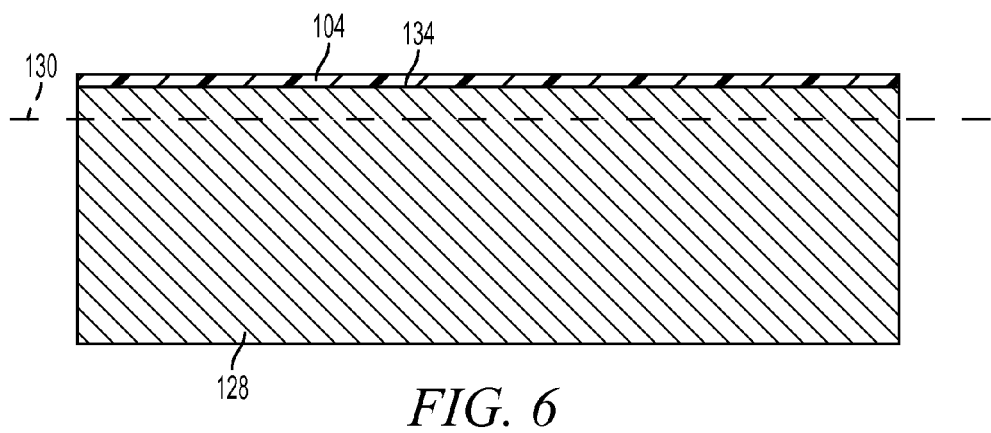

As shown in FIG. 6, a layer of dielectric material 104 may be provided on a surface 134 of the donor structure 128 to be bonded to the structure 116 of FIG. 3. The layer of dielectric material 104 may be provided on the surface 134 before or after implanting ions into the donor structure 128 along the ion implant plane 130 as described above with reference to FIG. 5. The layer of dielectric material 104 may be provided on the surface 134 of the donor structure 128 by, for example, oxidizing the surface 134 of the donor structure 128, or by depositing the dielectric material 104 onto the surface 134 of the donor structure 128 using, for example, a chemical vapor deposition (CVD) process.

Figure 7:
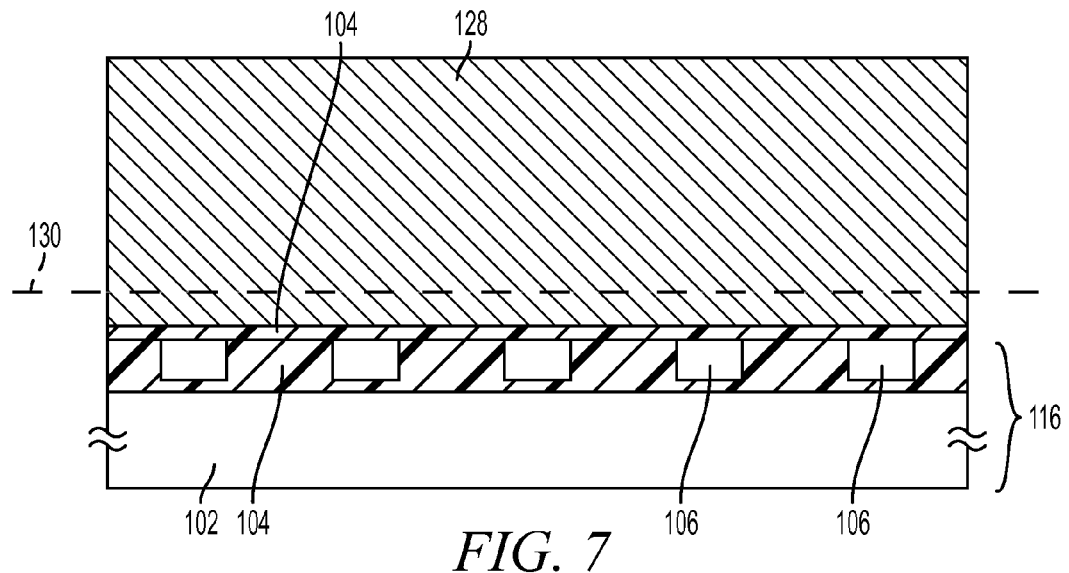

Referring to FIG. 7, the dielectric material 104 on the donor structure 128 is brought into direct physical contact with the dielectric material 104 on the major surface of the substrate 102 of the structure 116 (also shown in FIG. 3). Prior to abutting the surfaces of the dielectric material 104 together, the surfaces may be smoothened and prepared for bonding by, for example, subjecting the surfaces to one or more of a grinding process, an etching process, and a polishing process (e.g., a chemical-mechanical polishing (CMP) process) to reduce a surface roughness of the bonding surfaces. The surfaces of the dielectric material 104 also may be subjected to an annealing process prior to abutting the surfaces together for bonding.

Figure 8:
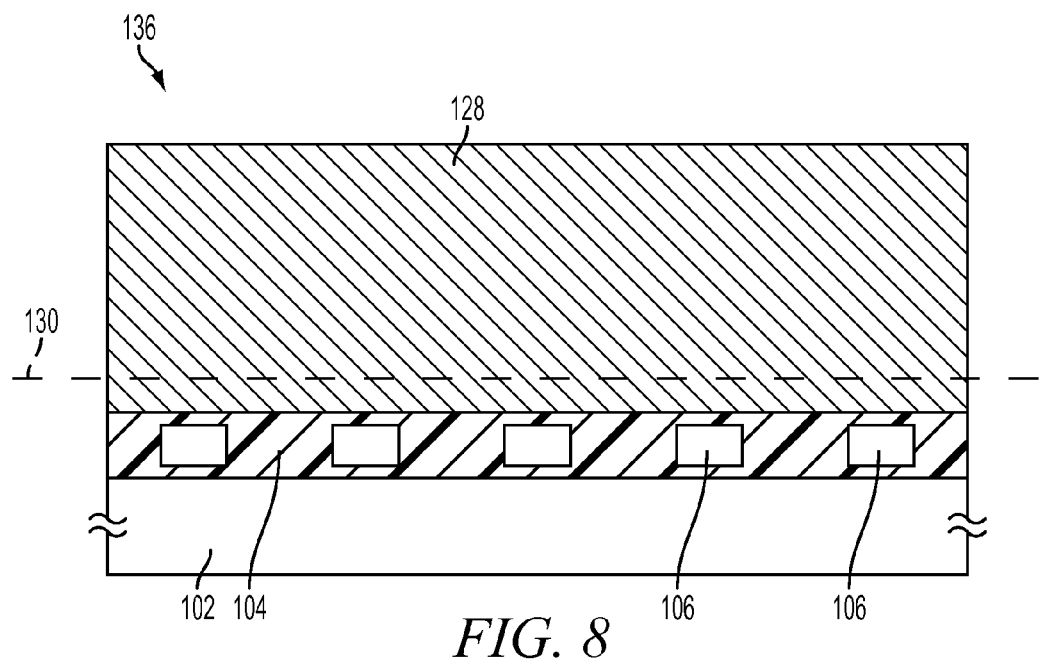

As shown in FIG. 8, after abutting the surfaces of the dielectric material 104 together, direct dielectric-to-dielectric atomic bonds may be established between the dielectric material 104 on the donor structure 128 and the dielectric material 104 on the substrate 102 of the structure 116 to form the bonded structure 136 shown in FIG. 8. Methods for establishing such direct atomic bonds are described in, for example, U.S. Patent Application Publication No. US 2011/0045611 A1, which published Feb. 24, 2011 in the name of Castex et al., the disclosure of which is incorporated herein in its entirety by this reference.

After forming the bonded structure 136 of FIG. 8, the donor structure 128 is cleaved or otherwise fractured along the ion implant plane 130 to form the structure 120 of FIG. 4. For example, the donor structure 128 (with the substrate 102 bonded thereto through the dielectric material 104) may be heated to cause the donor structure 128 to fracture along the ion implant plane 130. Optionally, mechanical forces may be applied to the donor structure 128 to assist in the cleaving of the donor structure 128 along the ion implant plane 130. After the donor structure 128 has been cleaved or otherwise fractured along the ion implant plane 130, a portion of the donor structure 128 remains bonded to the substrate 102 through the dielectric material 104, which portion defines the layer of semiconductor material 122 (FIG. 4). A remainder of the donor structure 128 may be reused in further SMARTCUT® processes to transfer additional portions of the donor structure 128 to additional substrates.

Referring again to FIG. 4, after the fracturing process, an exposed major surface 140 of the layer of semiconductor material 122 comprises a fractured surface of the donor structure 128 (FIG. 8), and may include ion impurities and imperfections in the crystal lattice of the layer of semiconductor material 122. The layer of semiconductor material 122 may be treated in an effort to reduce impurity levels and improve the quality of the crystal lattice (i.e., reduce the number of defects in the crystal lattice proximate the exposed major surface 140) in the layer of semiconductor material 122. Such treatments may involve one or more of grinding, polishing, etching, and thermal annealing.

In other embodiments, the layer of semiconductor material 122 may be provided on the substrate 102 by bonding bulk semiconductor material to the dielectric material 104 on the substrate 102 and subsequently thinning the bulk semiconductor material to the thickness $T_S$ using one or more of a grinding process, a polishing process, and an etching process (e.g., a chemical-mechanical polishing process) to form the layer of semiconductor material 122. It may be difficult to transfer layers of semiconductor material 122 having a thickness $T_S$ greater than about one and one-half microns (1.5 µm) using the SMARTCUT® process as described above, although layers of semiconductor material 122 having thicknesses $T_S$ greater than about one and one-half microns (1.5 µm) may be formed using a bonding and thinning process.

With continued reference to FIG. 4, in the methods described above, the fluidic microchannels 124 are formed within the layer of dielectric material 104 by forming recesses 106 (FIG. 3) only in the dielectric material 104 on the substrate 102 prior to providing the layer of semiconductor material 122 on the dielectric material 104 and the substrate 102. In additional embodiments of methods of the present disclosure, the fluidic microchannels 124 may be formed within the layer of dielectric material 104 by forming recesses in the dielectric material 104 on the semiconductor material 122 (or the donor structure 128 of FIG. 6) prior to providing the layer of semiconductor material 122 on the dielectric material 104 and the substrate 102, or by forming recesses in both the dielectric material 104 on the substrate 102 and the dielectric material 104 on the semiconductor material 122 (or the donor structure 128 of FIG. 6) prior to providing the layer of semiconductor material 122 on the dielectric material 104 and the substrate 102. Examples of such methods are disclosed below with reference to FIGS. 9 and 10.

Figure 9:
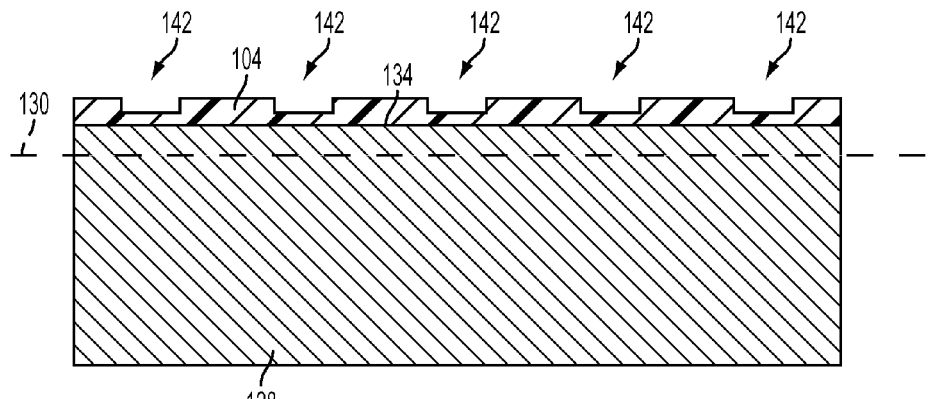
FIGS. 9 and 10 illustrate another method that may be used to provide the layer of semiconductor material shown in FIG. 4 over the structure of FIG. 3, wherein portions of fluidic microchannels are also formed in a dielectric material on a donor structure.

FIG. 9 is similar to FIG. 6 and illustrates the donor structure 128 having ions implanted therein along the ion implant plane 130, and a dielectric material 104 on the surface 134 of the donor structure 128. As shown in FIG. 9, recesses 142 may be formed in the layer of dielectric material 104 on the donor structure 128. The recesses 142 may be at least substantially similar to the recesses 106 formed in the dielectric material 104 on the substrate 102 (FIG. 3), and may be formed as previously described with reference to the recesses 106 of FIGS. 2A, 2B, and 3. The recesses 142 of FIG. 9, however, may be formed in a pattern that is a mirror image of the recesses 106 of FIG. 3.

Figure 10:
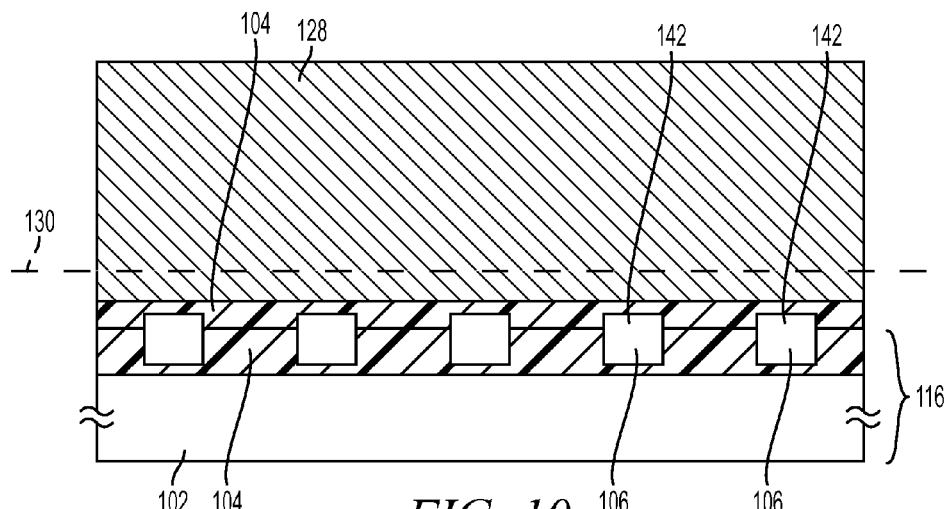

FIG. 10 is similar to FIG. 7 and illustrates the dielectric material 104 on the donor structure 128 in direct physical contact with the dielectric material 104 on the major surface of the substrate 102 of the structure 116 (also shown in FIG. 3). As shown in FIG. 10, the recesses 142 in the dielectric material 104 on the donor structure 128 may be aligned with the complementary recesses 106 formed in the dielectric material 104 on the substrate 102. Prior to abutting the surfaces of the dielectric material 104 together, the surfaces may be prepared for bonding as previously described, after which a direct bonding process may be used to establish direct dielectric-to-dielectric atomic bonds between the dielectric material 104 on the donor structure 128 and the dielectric material 104 on the substrate 102, as previously described with reference to FIG. 8.

Thus, one or more laterally extending recesses may be formed in at least one of the dielectric material 104 on the substrate 102 and the dielectric material 104 on the semiconductor material of the donor structure 128 prior to bonding the donor structure 128 to the substrate 102 by establishing dielectric-to-dielectric atomic bonds directly between the dielectric material 104 on the substrate 102 and the dielectric material 104 on the donor structure 128 and defining one or more fluidic microchannels 124 (FIG. 4) between the dielectric materials 104 at the interface therebetween. Further, the fluidic microchannels 124 are partially defined by the recesses 142 in the dielectric material 104 on the donor structure 128 and partially defined by the recesses 106 formed in the dielectric material 104 on the substrate 102.

The semiconductor structure 120 of FIG. 4 includes a single layer of fluidic microchannels 124 that are disposed in a single, common plane and that are at least substantially entirely embedded within and surrounded by the dielectric material 104 between the layer of semiconductor material 122 and the substrate 102. Optionally, additional layers of fluidic microchannels 124 may be formed on the structure 120 of FIG. 4. Some such additional layers of fluidic microchannels 124 may include fluidic microchannels that extend at least partially within the layer of semiconductor material 122. Examples of such methods are disclosed below with reference to FIGS. 11 through 16.

Figure 11:
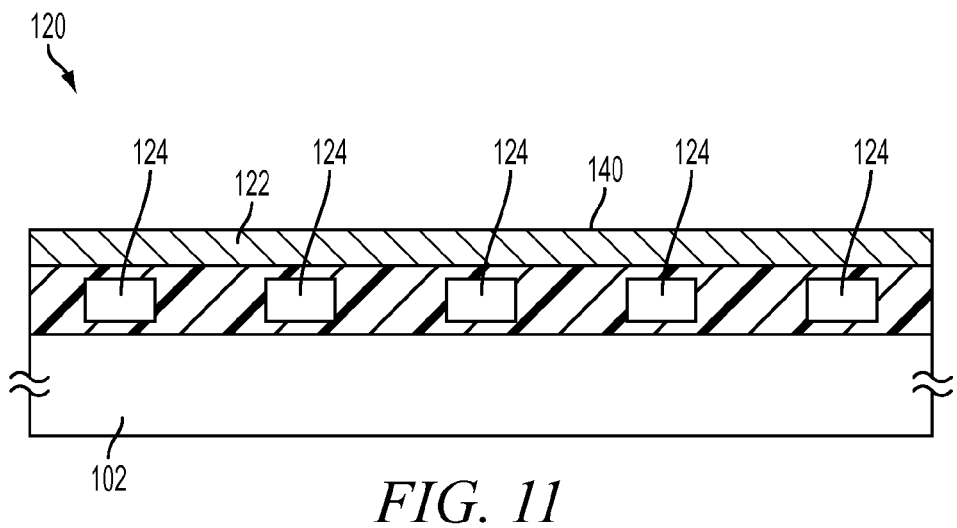
FIGS. 11 through 15 illustrate additional methods of the present disclosure in which fluidic microchannels are formed at least partially within the layer of semiconductor material in the structure shown in FIG. 4.

FIG. 11 is substantially similar to FIG. 4 and illustrates the SOI semiconductor structure 120, which includes fluidic microchannels 124 within the dielectric material 104 between the layer of semiconductor material 122 and the substrate 102.

Figure 12:
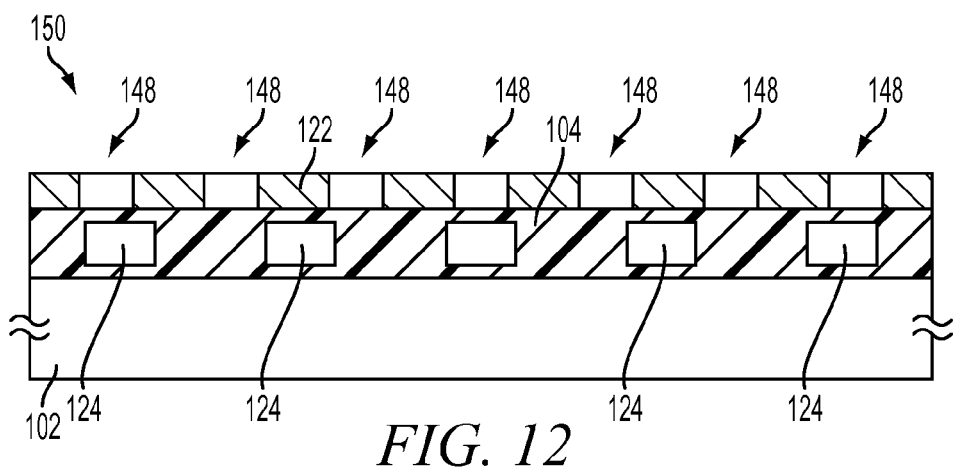

As shown in FIG. 12, one or more laterally extending recesses 148 may be formed in the layer of semiconductor material 122 to form the semiconductor structure 150 shown therein. The recesses 148 are used to form additional fluidic microchannels. The laterally extending recesses 148 may comprise apertures that extend entirely through the layer of semiconductor material 122 to the underlying dielectric material 104 in some embodiments. The recesses 148 may be generally similar to the recesses 106 previously described with reference to FIGS. 2A and 2B, and may be formed as previously described with reference to the recesses 106 of FIGS. 2A and 2B.

Figure 13:
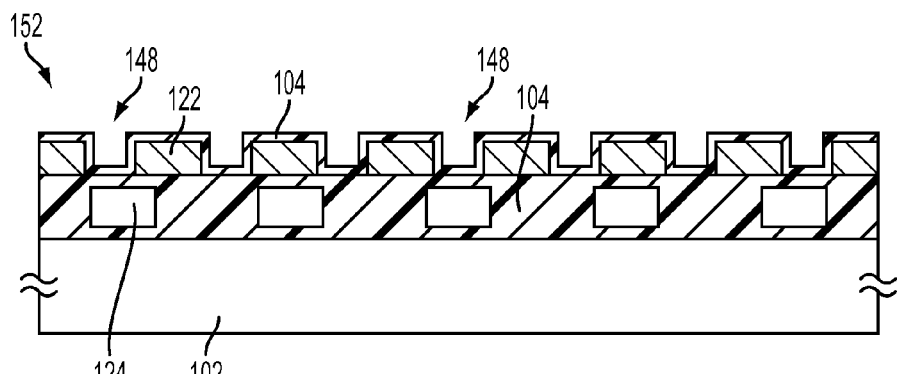

Referring to FIG. 13, dielectric material 104 may be provided over the semiconductor structure 150 of FIG. 12, including within the recesses 148 so as to cover the exposed surfaces of the layer of semiconductor material 122 within the recesses 148 with dielectric material 104, and form the structure 152 of FIG. 13. Again, this may prevent oxidation or other alteration of the surfaces within the recesses 148 and resulting fluidic microchannels when cooling fluid is caused to flow through the fluidic microchannels during operation. In some embodiments, the dielectric material 104 may be similar or identical in composition to the dielectric material 104 between the layer of semiconductor material 122 and the substrate 102. The dielectric material 104 may be formed as previously described herein.

Figure 14:
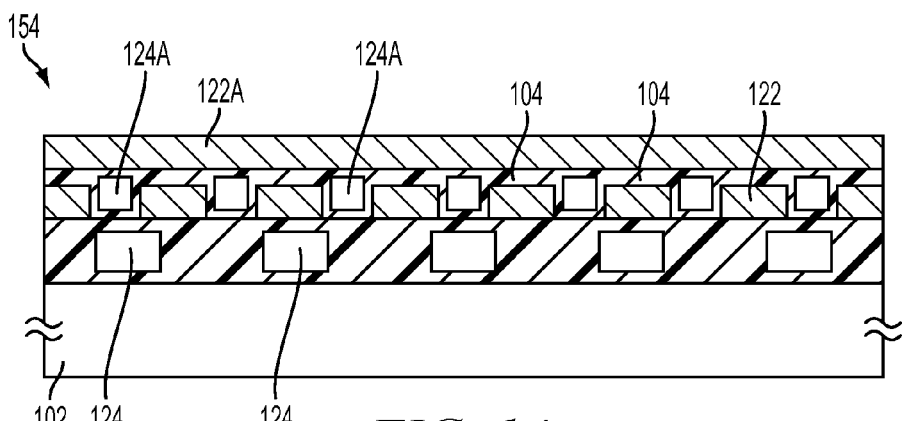

FIG. 14 illustrates a semiconductor structure 154 that may be formed by bonding another semiconductor material 122A over the layer of semiconductor material 122 first provided on the substrate 102 by establishing direct dielectric-to-dielectric atomic bonds directly between the dielectric material 104 provided over the first layer of semiconductor material 122 and a dielectric material 104 on the additional layer of semiconductor material 122A. As shown in FIG. 14, another plurality of fluidic microchannels 124A are defined between the dielectric material 104 on the dielectric material 104 provided over the first layer of semiconductor material 122 and the dielectric material 104 on the additional layer of semiconductor material 122A at the interface therebetween. As shown in FIG. 14, the fluidic microchannels 124A are at least partially defined by the recesses 148 previously formed in the first layer of semiconductor material 122. Further, the fluidic microchannels 124A have cross-sectional shapes shown in FIG. 14 that are entirely surrounded by dielectric material 104. The additional layer of semiconductor material 122A may be at least substantially similar to the layer of semiconductor material 122 first provided over the substrate 102, and the additional layer of semiconductor material 122A may be provided on the structure 152 of FIG. 13 to form the semiconductor structure 154 of FIG. 14 using methods as previously described herein with reference to FIGS. 4 through 10.

Figure 15:
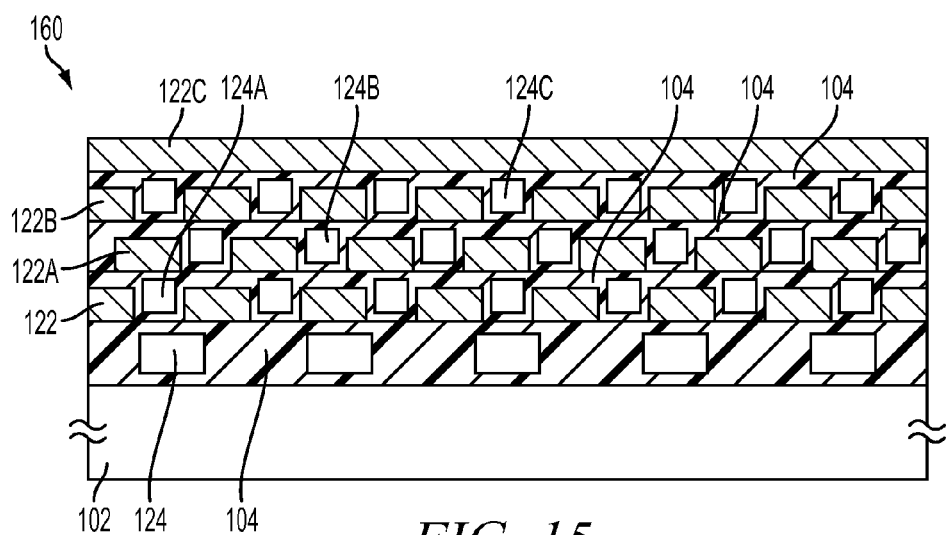

The processes described above with reference to FIGS. 12 through 14 may be repeated any number of times, as desirable, to provide any number of layers of fluidic microchannels in a resulting semiconductor structure. For example, FIG. 15 illustrates a semiconductor structure 160 that may be formed by repeating the processes described with reference to FIGS. 12 through 14 two additional times on the structure 154 of FIG. 14. The resulting semiconductor structure 154 includes a third layer of fluidic microchannels 124B formed in the additional layer of semiconductor material 122A, a fourth layer of fluidic microchannels 124C formed in a third layer of semiconductor material 122B, and a fourth layer of semiconductor material 124C provided over the fourth layer of fluidic microchannels 124C in the third layer of semiconductor material 122B.

In additional methods of the present disclosure, fluidic microchannels may be formed in a layer of semiconductor material 122 on an SOI semiconductor structure, as previously described with reference to FIGS. 11 through 14, without first forming fluidic microchannels 124 in the layer of electrically insulating dielectric material 104 between the layer of semiconductor material 122 and the underlying substrate 102, as previously described with reference to FIGS. 1 through 4. Examples of such methods are described below with reference to FIGS. 16 through 20.

Figure 16:
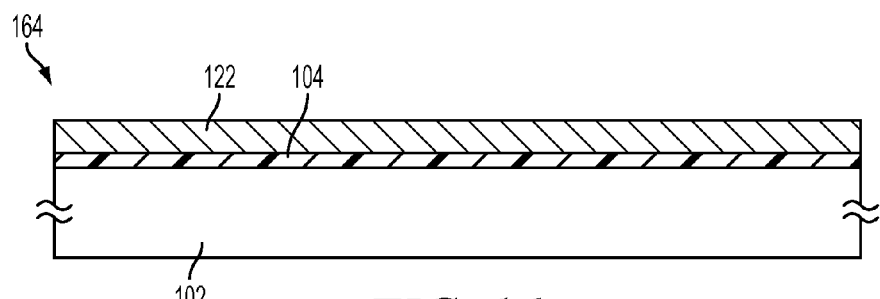
FIGS. 16 through 20 illustrate additional methods of the present disclosure in which fluidic microchannels are formed at least partially within a layer of semiconductor material provided over a substrate without first forming any fluidic microchannels in a dielectric material between the layer of semiconductor material and the substrate.

FIG. 16 illustrates a semiconductor structure 164 that includes a layer of semiconductor material 122 on a substrate 102 with a layer of dielectric material 104 between the layer of semiconductor material 122 and the substrate 102. The semiconductor structure 164 is generally similar to the structure 120 of FIG. 4, but does not include fluidic microchannels 124 as does the structure 120 of FIG. 4. Further, the layer of dielectric material 104 between the layer of semiconductor material 122 and the substrate 102 may be relatively thinner than the layer of dielectric material 104 of the structure 120 of FIG. 4 in some embodiments. The semiconductor structure 164 of FIG. 16, like the structure 120 of FIG. 4, may comprise a semiconductor-on-insulator (SOI) structure.

Figure 17:
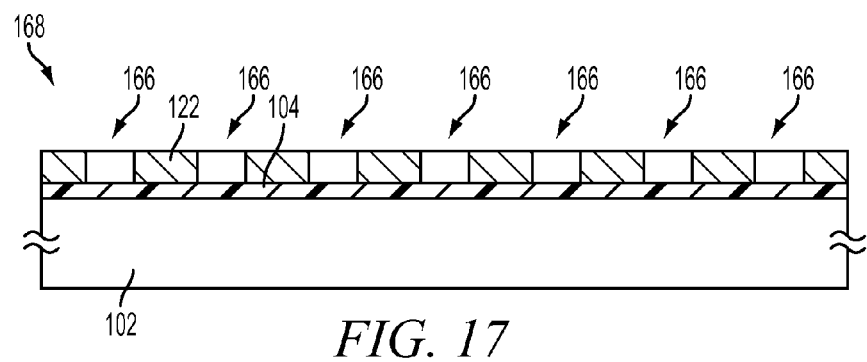

As shown in FIG. 17, one or more laterally extending recesses 166 may be formed in the layer of semiconductor material 122 to form the semiconductor structure 168 shown therein. The recesses 166 are used to form fluidic microchannels, which are ultimately defined therein. The laterally extending recesses 166 may comprise apertures that extend entirely through the layer of semiconductor material 122 to the underlying dielectric material 104 in some embodiments. The recesses 166 may be generally similar to the recesses 106 previously described with reference to FIGS. 2A and 2B and the recesses 148 of FIG. 12, and may be formed as previously described with reference to the recesses 106 of FIGS. 2A and 2B and the recesses 148 of FIG. 12.

Figure 18:
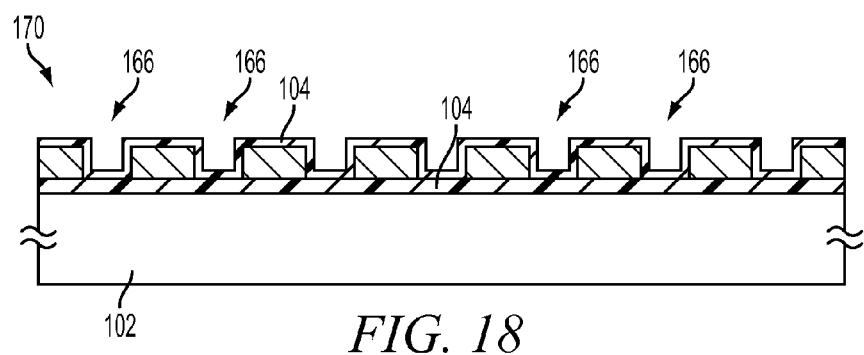

Referring to FIG. 18, dielectric material 104 may be provided on surfaces of the semiconductor structure 168 of FIG. 17, including the surfaces of the semiconductor material 122 within the recesses 166 so as to cover the exposed surfaces of the layer of semiconductor material 122 within the recesses 166 with the dielectric material 104, and form the structure 170 of FIG. 18. Again, this may prevent oxidation or other alteration of the surfaces within the recesses 166 and resulting fluidic microchannels when cooling fluid is caused to flow through the fluidic microchannels during operation. In some embodiments, the dielectric material 104 provided over the semiconductor material 122 may be similar or identical in composition to the dielectric material 104 between the layer of semiconductor material 122 and the substrate 102, and may be formed as previously described herein.

Figure 19:
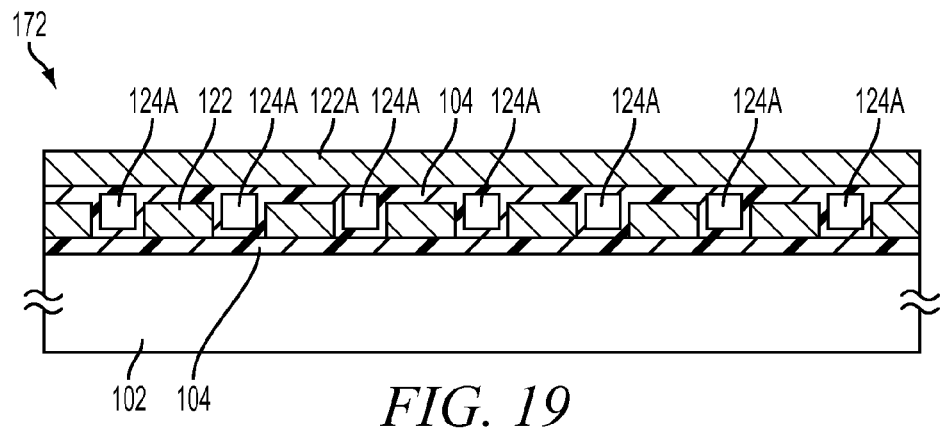

FIG. 19 illustrates a semiconductor structure 172 that may be formed by bonding another semiconductor material 122A over the layer of semiconductor material 122 first provided on the substrate 102 by establishing direct dielectric-to-dielectric atomic bonds directly between the dielectric material 104 provided over the first layer of semiconductor material 122 and a dielectric material 104 on the additional layer of semiconductor material 122A. As shown in FIG. 19, a plurality of fluidic microchannels 124A are defined between the dielectric material 104 provided over the first layer of semiconductor material 122 and the dielectric material 104 on the additional layer of semiconductor material 122A at the interface therebetween. The fluidic microchannels 124A are similar to those previously described with reference to FIG. 14, and are at least partially defined by the recesses 166 (FIG. 17) previously formed in the first layer of semiconductor material 122. Further, the fluidic microchannels 124A have cross-sectional shapes shown in FIG. 19 that are entirely surrounded by dielectric material 104. The additional layer of semiconductor material 122A may be at least substantially similar to the layer of semiconductor material 122 first provided over the substrate 102, and the additional layer of semiconductor material 122A may be provided on the structure 170 of FIG. 18 to form the structure 172 of FIG. 19 using methods as previously described herein with reference to FIGS. 4 through 10.

Figure 20:
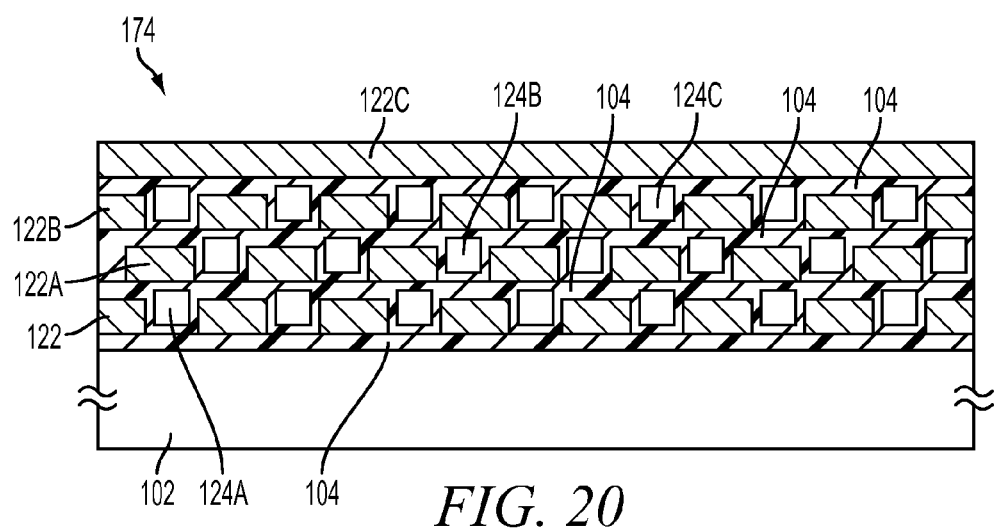

FIG. 20 illustrates a semiconductor structure 174 that may be formed by repeating the processes described with reference to FIGS. 17 through 19 two additional times on the structure 172 of FIG. 19. The resulting semiconductor structure 174 includes a second layer of fluidic microchannels 124B formed in the additional layer of semiconductor material 122A, a third layer of fluidic microchannels 124C formed in a third layer of semiconductor material 122B, and a fourth layer of semiconductor material 122C provided over the third layer of fluidic microchannels 124C in the third layer of semiconductor material 122B.

The semiconductor structures described herein that include fluidic microchannels therein, such as the semiconductor structure 120 of FIG. 4, the semiconductor structure 160 of FIG. 15, the semiconductor structure 172 of FIG. 19, and the semiconductor structure 174 of FIG. 20, may be employed as at least a portion of an interposer, which may be used for cooling one or more operational semiconductor devices, which may be bonded to, or otherwise structurally coupled with, the interposer during operation of the semiconductor devices.

Figure 21:
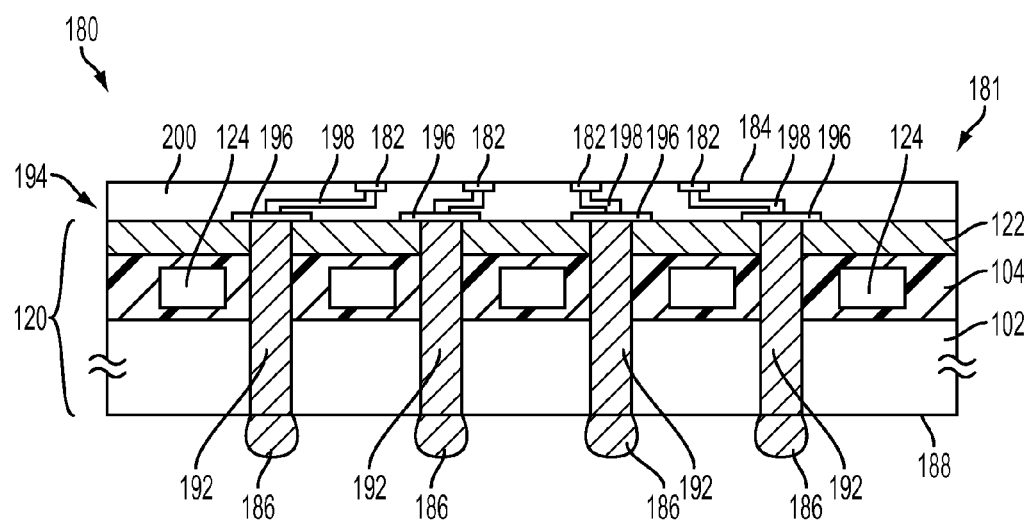
FIG. 21 illustrates an interposer comprising the semiconductor structure of FIG. 4 with a redistribution layer and electrical contacts thereon.

As a non-limiting example, FIG. 21 is a simplified illustration depicting an interposer 180. The interposer 180 has a multi-layer body 181 that includes the semiconductor structure 120 of FIG. 4, which comprises the layer of semiconductor material 122 bonded to the substrate 102 with the layer of dielectric material 104 between the semiconductor material 122 and the substrate 102. The layer of semiconductor material 122 optionally may be used to fabricate redistribution layers for a semiconductor device to be bonded to the interposer 180 as described herein. Additionally or alternatively, passive or active devices may be fabricated on or in the surface of the layer of semiconductor material 122 of the interposer 180. The semiconductor structure 120 within the interposer 180 further includes fluidic microchannels 124 extending in lateral directions through the layer of dielectric material 104. In other embodiments, the interposer 180 could include any of the previously described semiconductor structures in place of the semiconductor structure 120, and could include fluidic microchannels extending in lateral directions through the layer of semiconductor material 122, or through both the layer of semiconductor material 122 and the layer of dielectric material 104.

As shown in FIG. 21, the interposer 180 includes a first plurality of electrical contacts 182 on a first major surface 184 of the interposer 180, and a second plurality of electrical contacts 186 on a second major surface 188 of the interposer 180 on a side thereof opposite the first major surface 184. The electrical contacts 182, 186 may comprise any one of contact pads, contact balls, or contact bumps, and may comprise a metal or metal alloy (e.g., copper, aluminum, a solder alloy, etc.). As a non-limiting example, the electrical contacts 182 on the first major surface 184 may comprise bond pads, and the electrical contacts 186 on the second major surface 188 may comprise contact bumps, as shown in FIG. 21.

The interposer 180 further includes a plurality of vertically extending conductive vias 192 that extend at least partially through the interposer 180 and are used to provide electrical interconnections through the interposer 180 between electrical contacts 182 on the first major surface 184 and respective electrical contacts 186 on the second major surface 188.

In some embodiments, the electrical contacts 182 on the first major surface 184 of the interposer 180 may be disposed in a first pattern, and the electrical contacts 186 on the second major surface 188 may be disposed in a second pattern that is different than the first pattern. In such embodiments, a redistribution layer 194 may be provided on one or both sides of the semiconductor structure 120 to redistribute the pattern of the electrical contacts 182, 184 across the interposer 180. As a non-limiting example, a redistribution layer 194 may be formed over the layer of semiconductor material 122 of the semiconductor structure 120. The conductive vias 192 may comprise through-wafer vias that extend entirely through the semiconductor structure 120. The second plurality of electrical contacts 186 may be formed on exposed ends of the conductive vias 192 at the second major surface 188 of the interposer 180, which surface comprises an exposed major surface of the substrate 102 of the semiconductor structure 120. The redistribution layer 194 may be used to redistribute the pattern of the electrical contacts 186 and the conductive vias 192 to a different pattern of the electrical contacts 182.

Thus, the redistribution layer 194 may include a plurality of conductive features 196 that electrically and physically contact exposed ends of the conductive vias 192 at the surface of the layer of semiconductor material 122. The second plurality of electrical contacts 186 may be disposed in or on the redistribution layer 194 on a side thereof opposite the semiconductor structure 120. The redistribution layer 194 further includes an additional plurality of conductive features 198 that are used to interconnect the conductive features 196 with the electrical contacts 182. The additional plurality of conductive features 198 may comprise one or more of laterally extending conductive lines (e.g., traces) and vertically extending conductive vias. The conductive features 196, 198 and the electrical contacts 182 may comprise electrically conductive material regions (e.g., copper, aluminum, etc.) that are at least partially embedded in a dielectric material 200. The redistribution layer 194 may be formed in a layer-by-layer lithographic process on the layer of semiconductor material 122. In such processes, layers of dielectric material and layers of conductive material may be deposited and selectively patterned in an alternating manner to form the various materials and features of the redistribution layer 194.

The vertically extending conductive vias 192 and the conductive features 196, 198 of the redistribution layer 194 provide respective electrical interconnections or pathways between the electrical contacts 182 on the first major surface 184 of the interposer 180 and corresponding electrical contacts 186 on the second major surface 188 of the interposer 180.

In this configuration, one or more structures or devices may be structurally and electrically coupled to the electrical contacts 182 on the first major surface 184 of the interposer 180, and one or more additional structures or devices may be structurally and electrically coupled to the electrical contacts 186 on the second major surface 188 of the interposer 180. The interposer 180 thus becomes interposed between structures or devices attached to opposing sides of the interposer 180.

In additional embodiments, the interposer 180 may not include any redistribution layer 194, and the conductive vias 192 may extend entirely through the interposer 180 such that the electrical contacts 182 on the first major surface 184 of the interposer 180 are disposed in a pattern that is a mirror image of the pattern in which the electrical contacts 186 on the second major surface 188 of the interposer 180 are disposed.

In some embodiments, a layout of the fluidic microchannels 124 within the interposer 180 may be designed such that certain areas of the interposer 180 may be free of fluidic microchannels 124 to enable the conductive vias 192 to be reliably fabricated in such areas without inadvertently contacting one of the fluidic microchannels 124 with a conductive via 192 during fabrication.

FIGS. 22 through 28 illustrate examples of methods that may be used to form an interposer 180 like that of FIG. 21.

Figure 22:
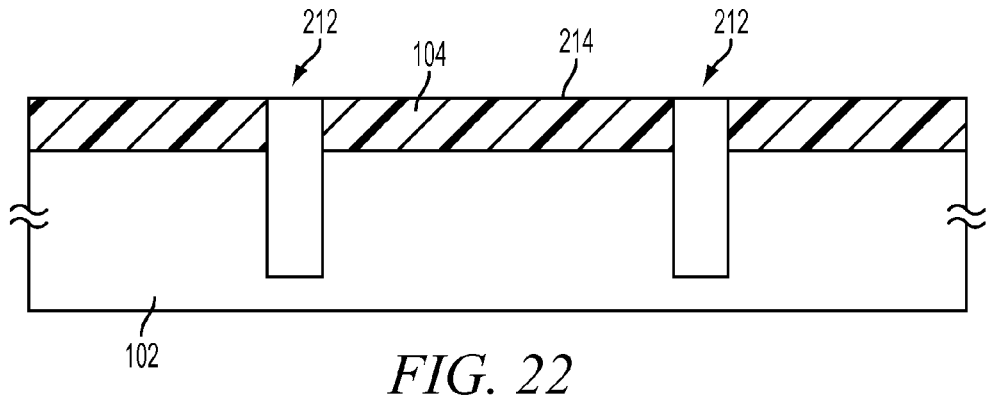
FIGS. 22 through 28 illustrate methods that may be used to fabricate an interposer like that shown in FIG. 21.

Referring to FIG. 22, a layer of dielectric material 104 may be provided on a substrate 102 (to form a structure 100 as shown in FIG. 1), after which holes 212 may be formed through the layer of dielectric material 104 and partially through the substrate 102 from an exposed surface 214 of the dielectric material 104 on a side thereof opposite the substrate 102. The holes 212 may be formed through the dielectric material 104 and into the substrate 102 using, for example, a photolithographic masking and etching process. In such embodiments, a mask layer may be deposited over the surface 214 of the dielectric material 104 and selectively patterned so as to form apertures through the mask layer at the locations at which it is desired to etch into the dielectric material 104 and the substrate 102 to form the holes 212. After forming the patterned mask layer, the regions of the dielectric material 104 (and ultimately the substrate 102) that are exposed through the patterned mask layer may be etched using, for example, a wet etching process or a dry reactive ion etching process to form the holes 212 through the dielectric material 104 and into the substrate 102. The holes may have any cross-sectional shape, such as a generally circular or a generally rectangular cross-sectional shape. After the etching process, the patterned mask layer may be removed.

Figure 23:
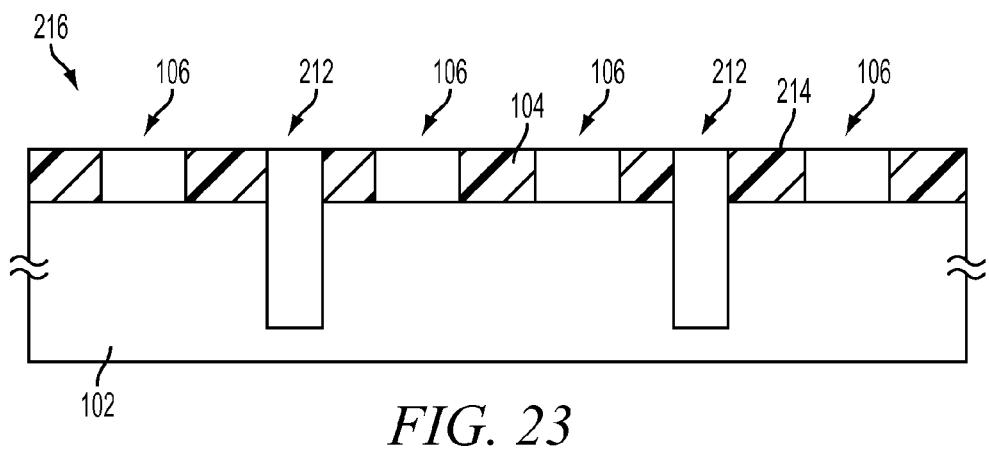

As shown in FIG. 23, one or more laterally extending recesses 106 that will ultimately be used to form fluidic microchannels 124 (FIG. 21) may be formed in the dielectric material 104 on the substrate 102 to form the structure 216 shown in FIG. 23. The recesses 106 may comprise recesses 106 as previously described with reference to FIGS. 2A and 2B, and may be formed using the methods disclosed with reference to FIGS. 2A and 2B.

Figure 24:
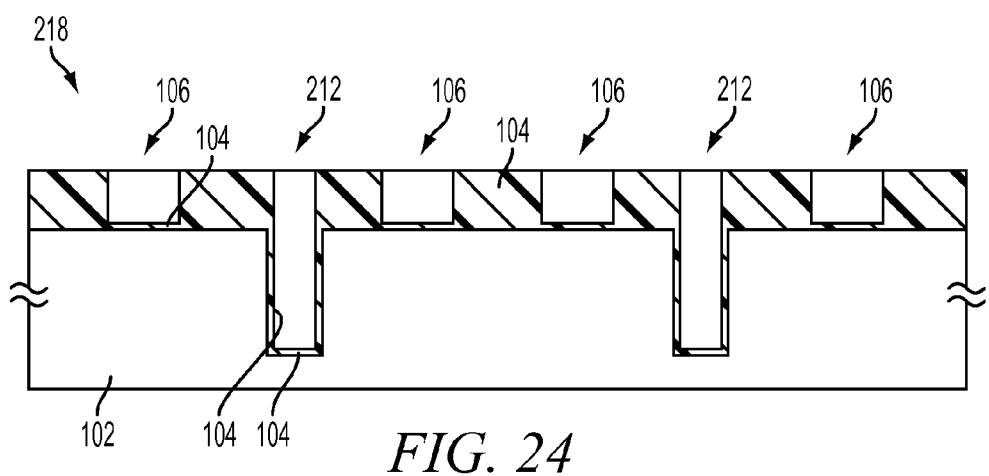

Referring to FIG. 24, additional dielectric material 104 may be provided over the semiconductor structure 216 of FIG. 23, including within the recesses 106 and within the holes 212 so as to cover the exposed surfaces of the substrate 102 within the recesses 106 and holes 212 with dielectric material 104 and form the structure 218 of FIG. 24.

Figure 25:
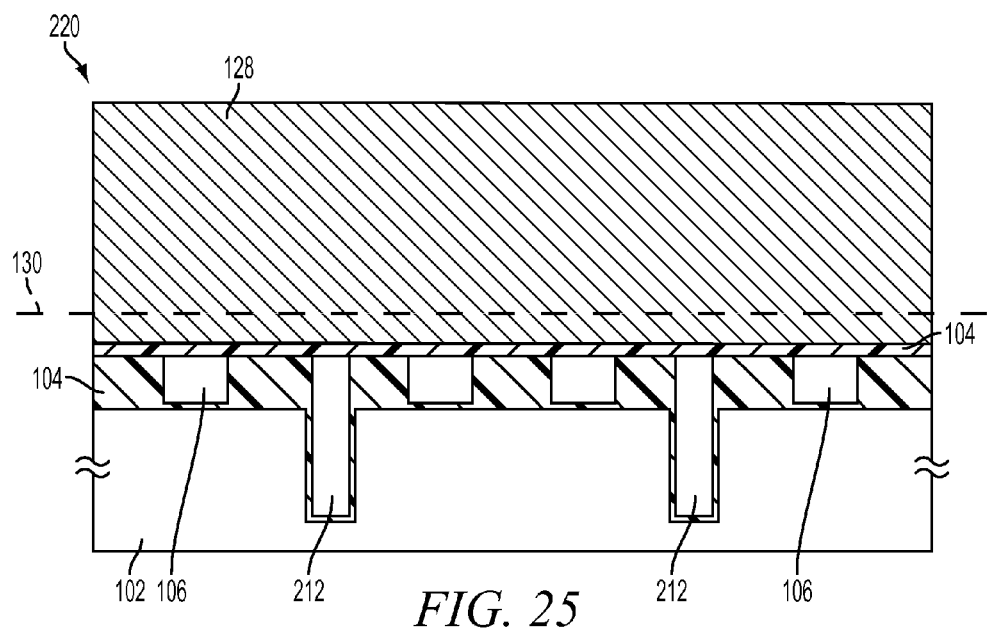

Referring to FIG. 25, a donor structure 128, which may include ions implanted therein along an ion implant plane 130, and which may be formed as previously described with reference to FIGS. 5 and 6, may be bonded over the substrate 102 as previously described herein with reference to FIGS. 7 and 8. In particular, a dielectric material 104 on the donor structure 128 may be brought into direct physical contact with the dielectric material 104 on the substrate 102, and direct dielectric-to-dielectric atomic bonds may be established between the dielectric material 104 on the donor structure 128 and the dielectric material 104 on the substrate 102 to form the bonded structure 220 shown in FIG. 25.

Figure 26:
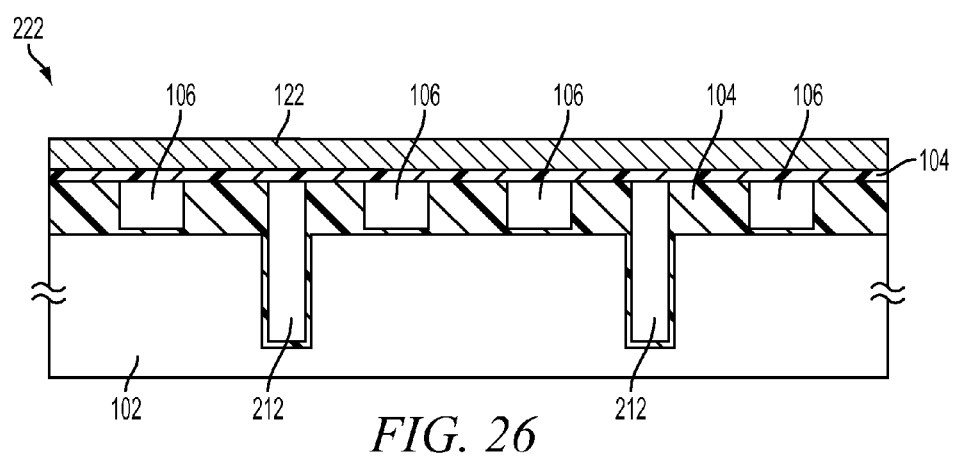

After forming the bonded structure 220 of FIG. 25, the donor structure 128 is cleaved or otherwise fractured along the ion implant plane 130 as previously described herein to form the structure 222 of FIG. 26, which includes a layer of semiconductor material 122 bonded over the substrate 102 (with the dielectric material 104 therebetween) and transferred from the donor structure 128 (FIG. 25). As shown in FIG. 26, the holes 212 may be buried within the structure 222, and may not extend through the layer of semiconductor material 122. In other words, the holes 212 may not communicate with the exterior of the structure 222.

Figure 27:
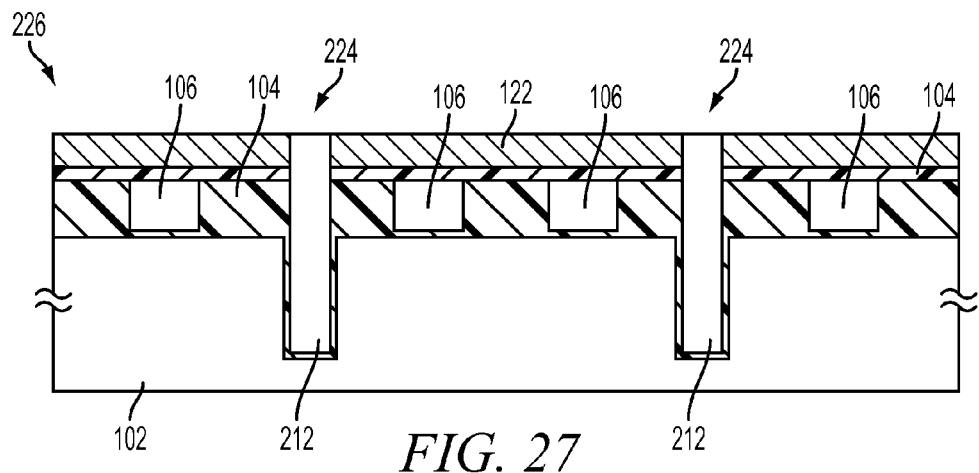

Thus, referring to FIG. 27, additional holes 224 may be etched or otherwise formed through the layer of semiconductor material 122 at the locations vertically above (from the perspective of FIG. 27) the holes 212 so as to extend the holes 212 through the layer of semiconductor material 122, and form structure 226 of FIG. 27. The additional holes 224 may be formed through the layer of semiconductor material 122 using processes previously described for forming the holes 212.

Figure 28:
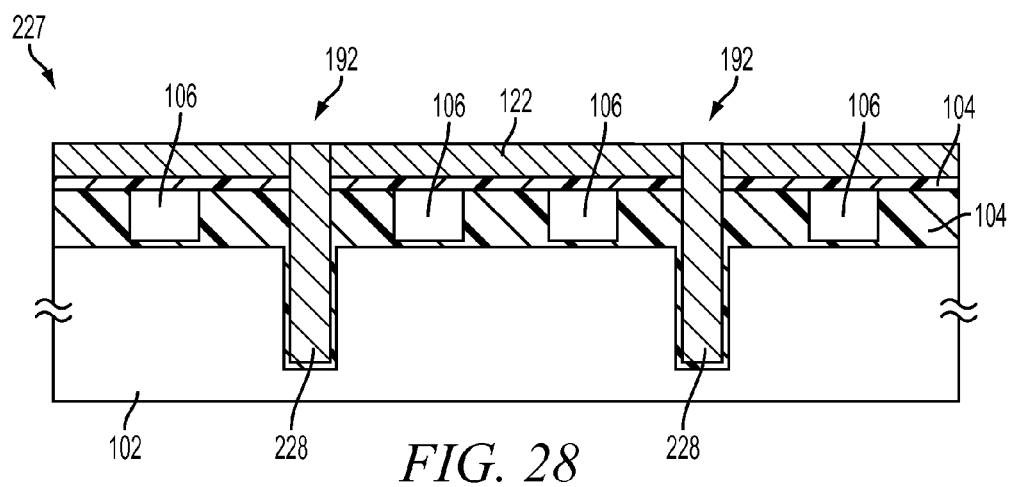

After extending the holes 212 through the layer of semiconductor material 122 as described with reference to FIG. 27, a conductive material 228 may be provided within the holes 212 to complete formation of the conductive vias 192 and form the structure 227 shown in FIG. 28. The conductive material 228 may comprise, for example, one or more metals or metal alloys, or the conductive material 228 may comprise a doped semiconductor material, such as doped polysilicon. The conductive material 228 may be deposited within the holes 212 using one or more of a deposition process (e.g., a physical vapor deposition (PVD) process or a chemical vapor deposition (CVD) process), an electroless plating process, and an electrolytic plating process.

The substrate 102 then may be thinned by removing material from the exposed major surface thereof on the side thereof opposite the dielectric material 104 using one or more of a grinding process, an etching process, and a polishing process (e.g., a chemical-mechanical polishing (CMP) process). The substrate 102 may be thinned until ends of the conductive vias 192 are exposed through the substrate 102, which results in the formation of a semiconductor structure substantially similar to the semiconductor structure 120 of FIG. 4, but including the conductive vias 192 therein. The redistribution layer 194 (FIG. 21) then may be formed on the layer of semiconductor material 122, and the electrical contacts 186 may be formed on the exposed ends of the conductive vias 192 to form the interposer 180 of FIG. 21.

In the methods described above with reference to FIGS. 22 through 28, the holes 212 are not filled with conductive material 228 until the holes 212 have been extended through the layer of semiconductor material 122 as described with reference to FIG. 27. In additional methods, a portion of the holes 212 may be filled with conductive material 228 prior to extending the holes 212 through the layer of semiconductor material 122. Examples of such methods are described below with reference to FIGS. 29 through 35.

Figure 29:
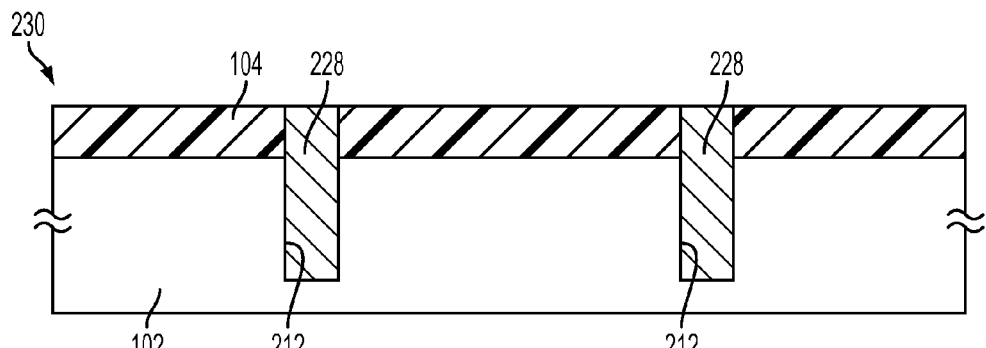
FIGS. 29 through 35 illustrate additional methods that may be used to fabricate an interposer like that shown in FIG. 21.

Referring to FIG. 29, a layer of dielectric material 104 may be provided on a substrate 102 (to form a structure 100 as shown in FIG. 1), after which holes 212 may be formed through the layer of dielectric material 104 and partially through the substrate 102 from an exposed surface 214 of the dielectric material 104 on a side thereof opposite the substrate 102. The holes 212 may be formed as previously described. After forming the holes 212, the holes 212 may be formed with conductive material 228 to complete formation of lower sections (from the perspectives of the figures) of the conductive vias 192 (FIG. 21) to be formed therein, and form the structure 230 shown in FIG. 29. As previously discussed, the conductive material 228 may comprise, for example, one or more metals or metal alloys, or the conductive material 228 may comprise a doped semiconductor material, such as doped polysilicon. The conductive material 228 may be deposited within the holes 212 using one or more of a deposition process (e.g., a physical vapor deposition (PVD) process or a chemical vapor deposition (CVD) process), an electroless plating process, and an electrolytic plating process.

Figure 30:
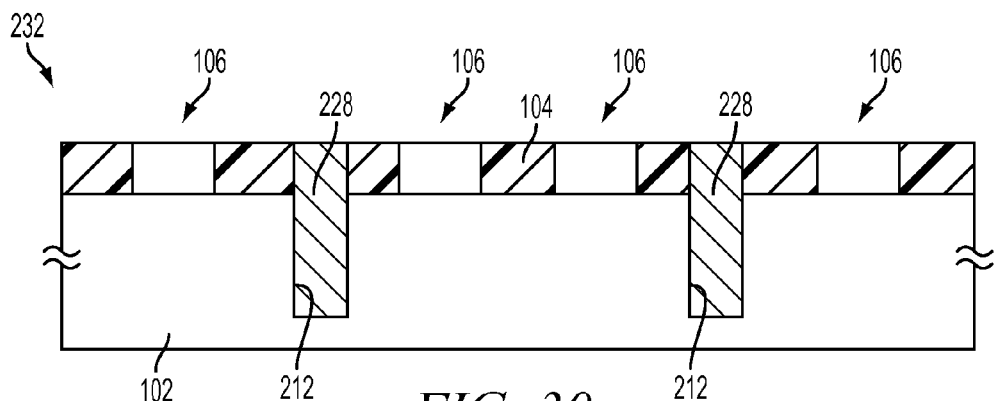

As shown in FIG. 30, one or more laterally extending recesses 106 that will ultimately be used to form fluidic microchannels 124 (FIG. 21) may be formed in the dielectric material 104 on the substrate 102 to form the structure 232 shown in FIG. 30. The recesses 106 may comprise recesses 106 as previously described with reference to FIGS. 2A and 2B, and may be formed using the methods disclosed with reference to FIGS. 2A and 2B.

Figure 31:
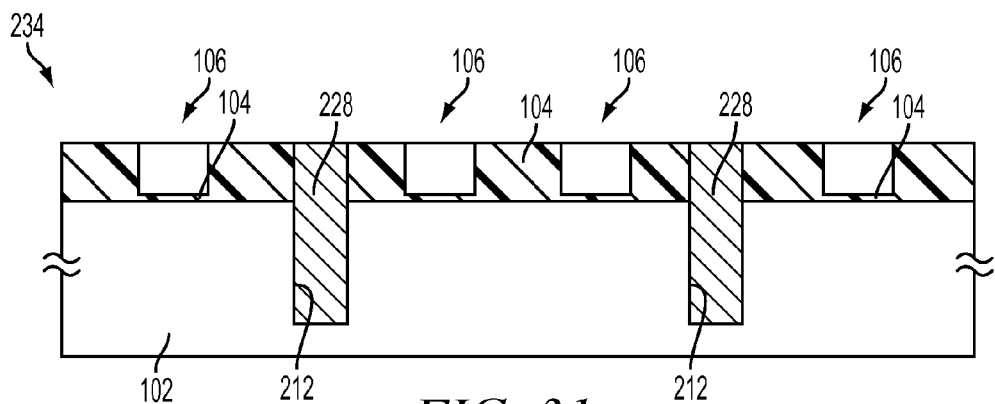

Referring to FIG. 31, additional dielectric material 104 may be provided over a semiconductor structure 232 of FIG. 30, including within the recesses 106 so as to cover the exposed surfaces of the substrate 102 within the recesses 106 with dielectric material 104 and form structure 234 of FIG. 31.

Figure 32:
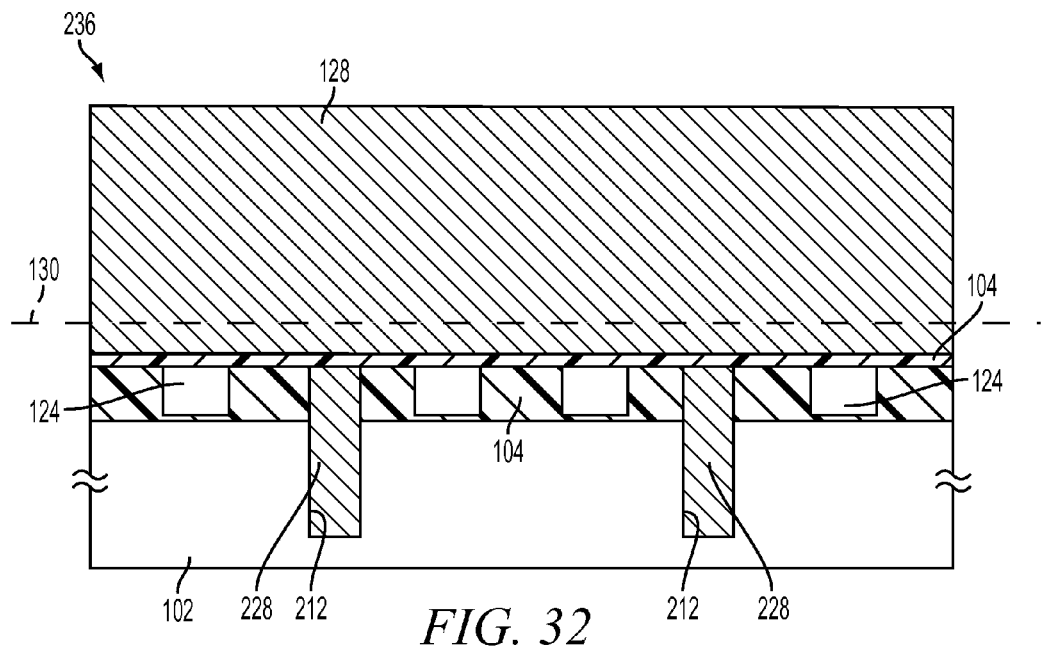

Referring to FIG. 32, a donor structure 128, which may include ions implanted therein along an ion implant plane 130, and which may be formed as previously described with reference to FIGS. 5 and 6, may be bonded over the substrate 102 as previously described herein with reference to FIGS. 7 and 8. In particular, a dielectric material 104 on the donor structure 128 may be brought into direct physical contact with the dielectric material 104 on the substrate 102, and direct dielectric-to-dielectric atomic bonds may be established between the dielectric material 104 on the donor structure 128 and the dielectric material 104 on the substrate 102 to form bonded structure 236 shown in FIG. 32.

Figure 33:
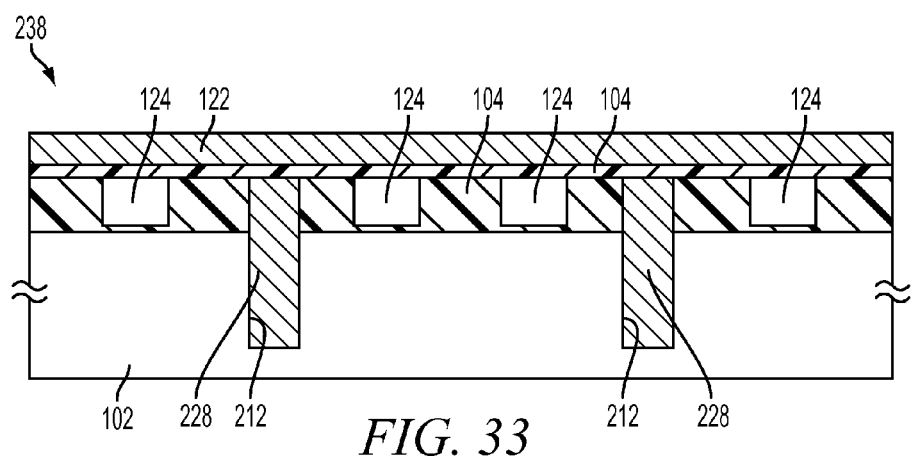

After forming the bonded structure 236 of FIG. 32, the donor structure 128 is cleaved or otherwise fractured along the ion implant plane 130 as previously described herein to form the structure 238 of FIG. 33, which includes a layer of semiconductor material 122 bonded over the substrate 102 (with the dielectric material 104 therebetween) and transferred from the donor structure 128 (FIG. 32). As shown in FIG. 33, the sections of the conductive vias 192 (FIG. 21) defined by the conductive material 228 within the holes 212 may be buried within the structure 238, and may not extend through the layer of semiconductor material 122.

Figure 34:
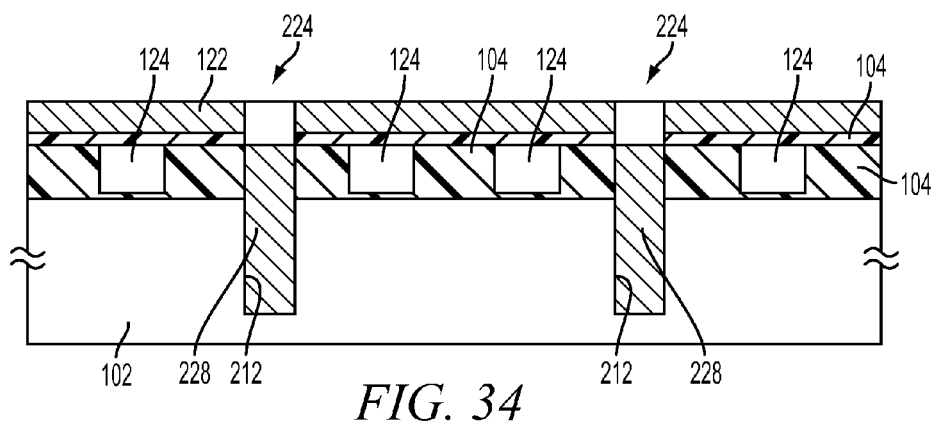

Thus, referring to FIG. 34, additional holes 224 may be etched or otherwise formed through the layer of semiconductor material 122 at the locations vertically above (from the perspective of FIG. 34) the holes 212 and the conductive material 228 therein so as to extend the holes 212 through the layer of semiconductor material 122. The additional holes 224 may be formed through the layer of semiconductor material 122 using processes previously described for formation of the holes 212.

Figure 35:
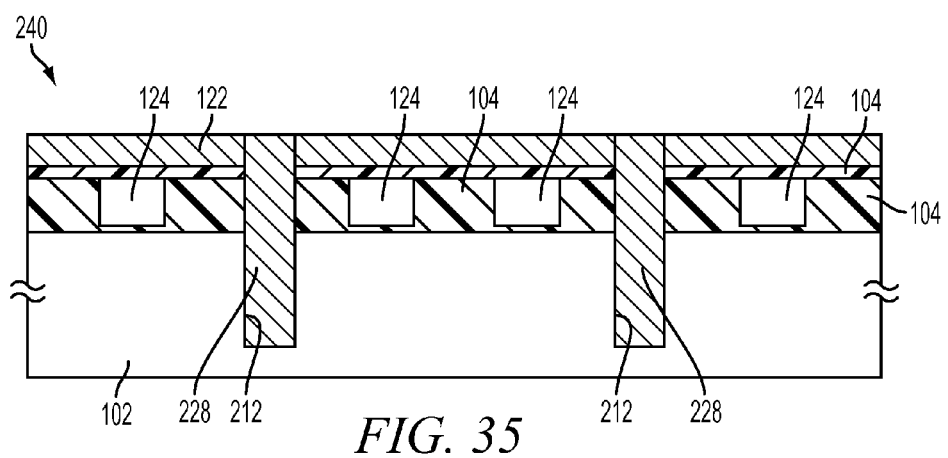

After forming the additional holes 224 to extend the holes 212 through the layer of semiconductor material 122, additional conductive material 228 may be provided within the holes 224 to complete formation of the conductive vias 192 and form the structure 240 shown in FIG. 35. The conductive material 228 may be deposited in the additional holes 224 using the previously described methods.

The substrate 102 then may be thinned by removing material from the exposed major surface thereof on the side thereof opposite the dielectric material 104 using one or more of a grinding process, an etching process, and a polishing process (e.g., a chemical-mechanical polishing (CMP) process). The substrate 102 may be thinned until ends of the conductive vias 192 are exposed through the substrate 102, which results in the formation of a semiconductor structure substantially similar to the semiconductor structure 120 of FIG. 4, but including the conductive vias 192 therein. The redistribution layer 194 (FIG. 21) then may be formed on the layer of semiconductor material 122, and the electrical contacts 186 may be formed on the exposed ends of the conductive vias 192 to form the interposer 180 of FIG. 21.

Figure 36:
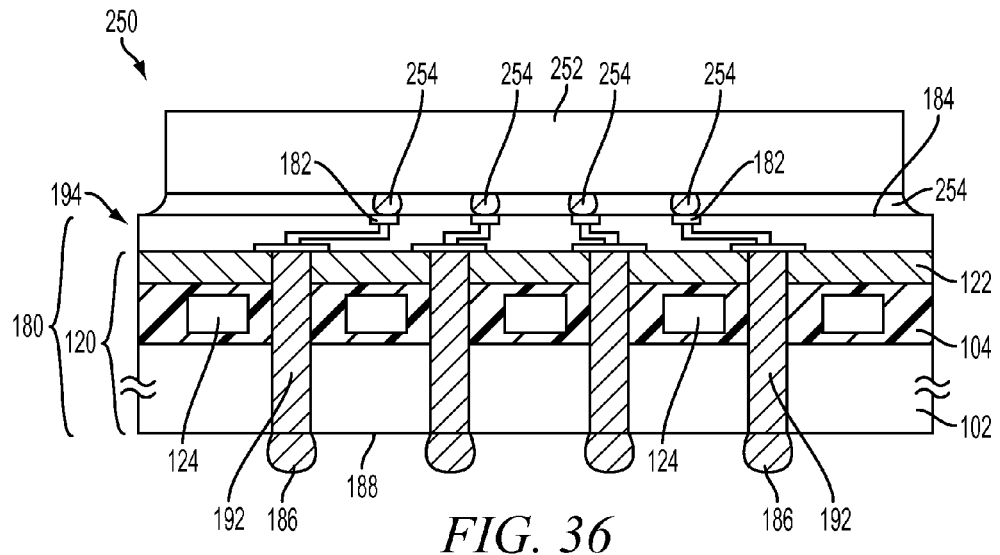
FIG. 36 illustrates a semiconductor structure that includes an operational semiconductor device structurally and electrically coupled to electrical contacts on one side of the interposer of FIG. 21.

FIG. 36 illustrates another semiconductor structure 250 of the present disclosure that includes the interposer 180 of FIG. 21, which interposer 180 includes the semiconductor structure 120 of FIG. 4. As previously mentioned, in additional embodiments, the interposer 180 may include any of the semiconductor structures described herein that include fluidic microchannels, such as the semiconductor structure 160 of FIG. 15, the semiconductor structure 172 of FIG. 19, or the semiconductor structure 174 of FIG. 20, for example. The semiconductor structure 250 further includes an operational semiconductor device 252. The semiconductor device 252 may comprise, for example, an electronic signal processing device, a memory device, an application specific integrated circuit (ASIC) device, and/or a photoactive device (e.g., a light-emitting diode (LED)). The semiconductor device 252 is structurally and electrically coupled to the interposer 180. For example, the semiconductor device 252 may comprise electrical contacts 254, which may be structurally and electrically coupled to the electrical contacts 182 on the first major surface 184 of the interposer 180. By way of example and not limitation, the electrical contacts 254 of the semiconductor device 252 may comprise conductive bumps, and the electrical contacts 182 of the interposer 180 may comprise bond pads. The conductive bumps of the electrical contacts 254 may be brought into direct physical contact with the bond pads of the electrical contacts 182 and subjected to a thermocompression bonding process or a reflow bonding process to establish physical and electrical interconnections between the conductive bumps and the bond pads. An underfill material 255 optionally may be provided between the semiconductor device 252 and the interposer 180. In further embodiments, the semiconductor device 252 may be directly bonded to the interposer 180 without the need for the intermediate electrical contacts 182 and underfill material 254.

The semiconductor structure 250 may be sold as a packaged device, which then could be operably coupled to higher level substrates or devices as needed or desirable using the electrical contacts 186 on the second major surface 188 of the interposer 180. During operation of the semiconductor device 252, a cooling fluid could be circulated through the fluidic microchannels 124 in the interposer 180 as previously described to remove heat from the semiconductor device 252 through the interposer 180.

Figure 37:
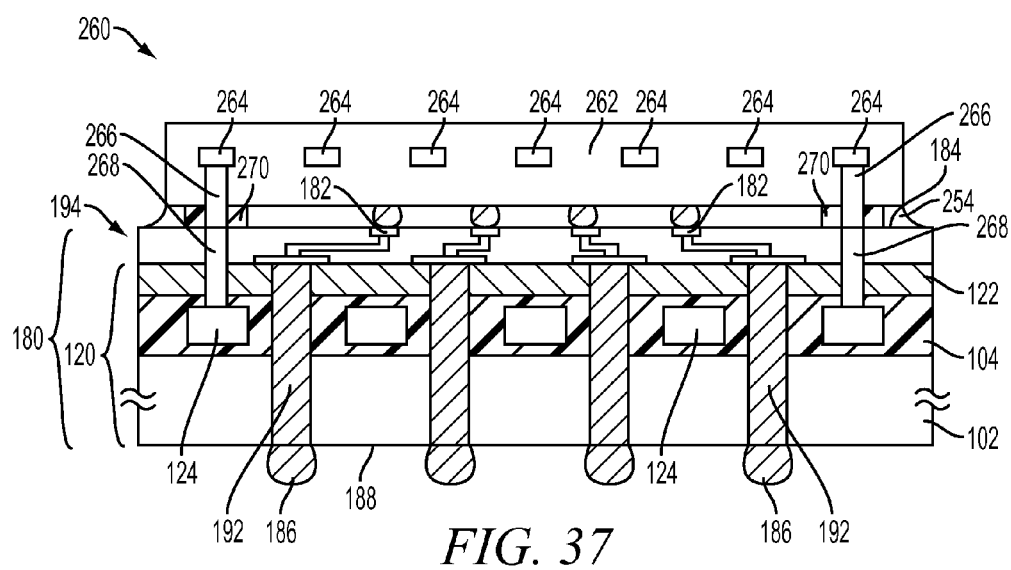
FIG. 37 illustrates another semiconductor structure similar to that of FIG. 36, but further including fluid microchannels operably coupled with the fluidic microchannels within the interposer by way of vertically extending fluidic interconnects.

In some embodiments, the operational semiconductor device 252 also may comprise additional fluidic microchannels. For example, FIG. 37 illustrates another semiconductor structure 260 that is substantially similar to the semiconductor structure 250 of FIG. 36, but includes a semiconductor device 262 comprising fluidic microchannels 264 therein. The fluidic microchannels 264 may be configured to receive cooling fluid therein. The semiconductor device 262 may comprise any of the types of devices previously mentioned, and may be structurally and electrically coupled to the interposer 180 as previously described with reference to FIG. 36.

Optionally, the fluidic microchannels 264 in the semiconductor device 262 may be coupled with the fluidic microchannels 124 in the interposer 180, as shown in FIG. 37, to provide enhanced cooling to the semiconductor structure 260 (relative to that of the semiconductor structure 250 of FIG. 36). By way of example and not limitation, vertically extending fluidic interconnects 266 may be formed in the semiconductor device 262 that extend to and communicate with the fluidic microchannels 264, and complementary fluidic interconnects 268 may be formed in the interposer 180 that extend to and communicate with the fluidic microchannels 124. The fluidic interconnects 266, 268 may comprise vertically extending holes or voids. During attachment of the semiconductor device 262 to the interposer 180, the fluidic interconnects 266 may be aligned with the fluidic interconnects 268, and fluid tight seals may be established therebetween. For example, fluid sealing members 270 (e.g., in-situ formed gaskets or O-rings) may be formed on one or both of the semiconductor device 262 and the interposer 180 around the openings to the fluidic interconnects 266 and/or the fluidic interconnects 268. The fluid sealing members 270 may prevent fluid flowing through the fluidic interconnects 266, 268 from leaking through the interface between the semiconductor device 262 and the interposer 180. In this configuration, fluid caused to flow through the fluidic microchannels 124 may also flow into the semiconductor device 262 and through the fluidic microchannels 264, and/or fluid caused to flow through the fluidic microchannels 264 may also flow into the interposer 180 and through the fluidic microchannels 124. If a direct bonding process is used, fluid sealing members 270 may not be needed.

Figure 38:
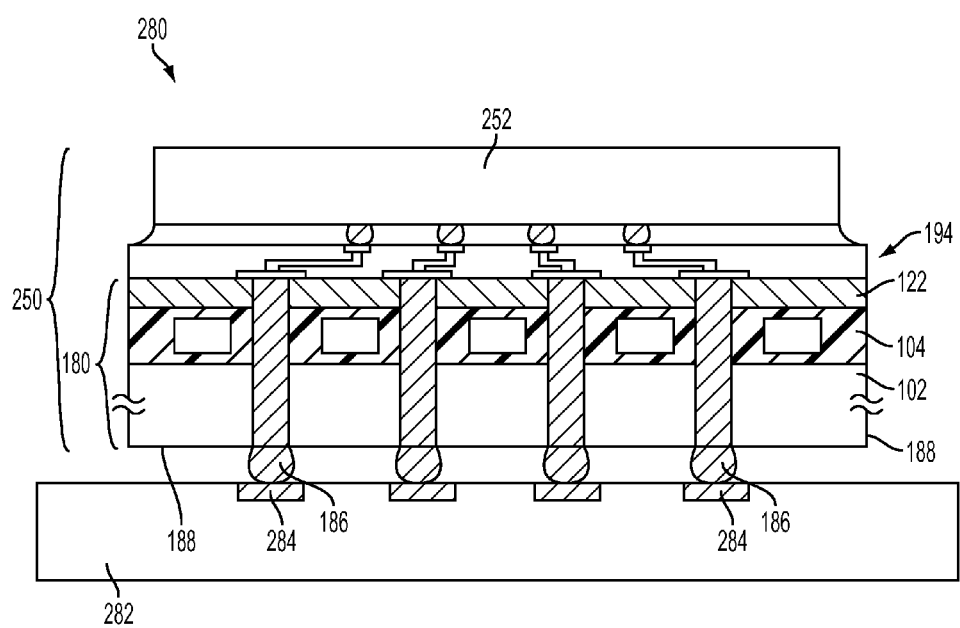
FIG. 38 illustrates another semiconductor structure that includes the interposer of FIG. 21, an operational semiconductor device structurally and electrically coupled to electrical contacts on one side of the interposer, and a higher level substrate structurally and electrically coupled to electrical contacts on an opposing side of the interposer.

As previously mentioned, interposers described herein, such as the interposer 180, may be interposed between structures or devices attached to opposing sides thereof. FIG. 38 illustrates a semiconductor structure 280 that includes the structure 250 of FIG. 36 structurally and electrically coupled to another structure or device 282, such that the interposer 180 is interposed between the semiconductor device 252 and the structure or device 282. By way of example and not limitation, the electrical contacts 186 on the second major surface 188 of the interposer 180 may be structurally and electrically bonded to complementary electrical contacts 284 (e.g., bond pads, etc.) on the another structure or device 282. The structure or device 282 may comprise, for example, a higher level substrate, such as a printed circuit board. In additional embodiments, the structure or device 282 may also comprise another semiconductor device, such as any of those types of devices previously mentioned herein.

Figure 39:
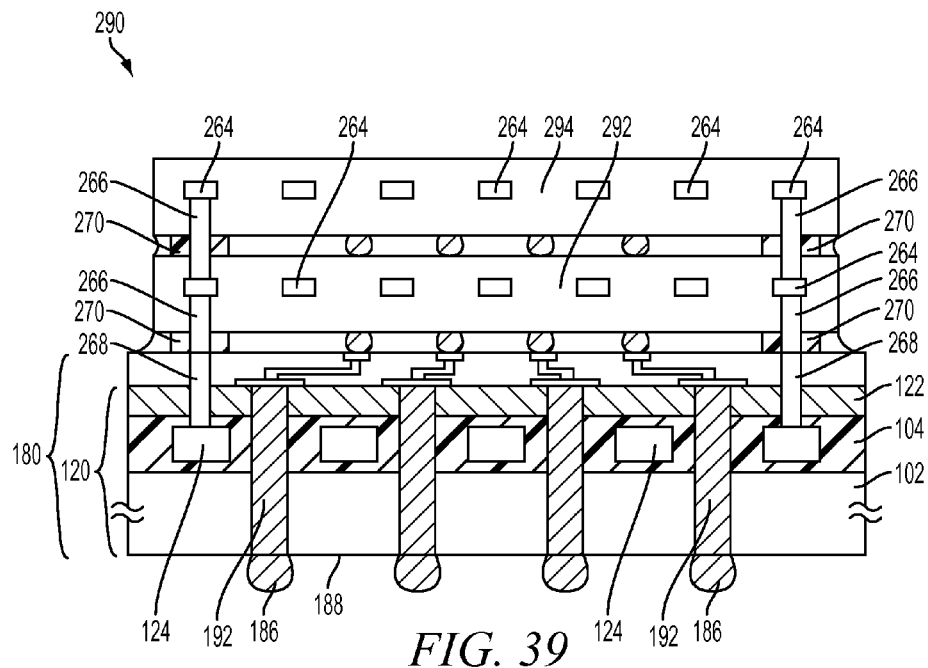
FIG. 39 illustrates another semiconductor structure that includes the interposer of FIG. 21, and two operational semiconductor devices vertically stacked over the interposer, wherein each of the operational semiconductor devices includes fluid microchannels operably coupled with the fluidic microchannels within the interposer by way of vertically extending fluidic interconnects.

In some embodiments, a plurality of semiconductor devices may be vertically stacked over interposers as described herein, such as the interposer 180, in a 3D integration process. For example, FIG. 39 illustrates another semiconductor structure 290 that includes a first semiconductor device 292 and a second semiconductor device 294 vertically stacked over an interposer 180. The first semiconductor device 292 may be structurally and electrically coupled to the interposer 180, and the second semiconductor device 294 may be structurally and electrically coupled to the first semiconductor device 292 on a side thereof opposite the interposer 180 as shown in FIG. 39. The semiconductor devices 292, 294 may comprise any of the types of devices previously mentioned. In some embodiments, the semiconductor devices 292, 294 and the interposer 180 may be stacked vertically one on top of another and bonded together using direct bonding processes.

Optionally, the first semiconductor device 292 and/or the second semiconductor device 294 may be similar to the semiconductor device 262 previously described with reference to FIG. 37, and may include fluidic microchannels 264 therein. In some embodiments, the fluidic microchannels 264 in one or both of the semiconductor devices 292, 294 may be coupled with the fluidic microchannels 124 in the interposer 180, as shown in FIG. 39. By way of example and not limitation, vertically extending fluidic interconnects 266 may be formed in the semiconductor devices 292, 294, which may be coupled with the fluidic interconnects 268 in the interposer 180 as previously described herein using fluid sealing members 270. In this configuration, fluid caused to flow through the fluidic microchannels 124 may also flow into the fluidic microchannels 264 within the semiconductor device 292 and into the fluidic microchannels 164 within the semiconductor device 294.

Figure 40:
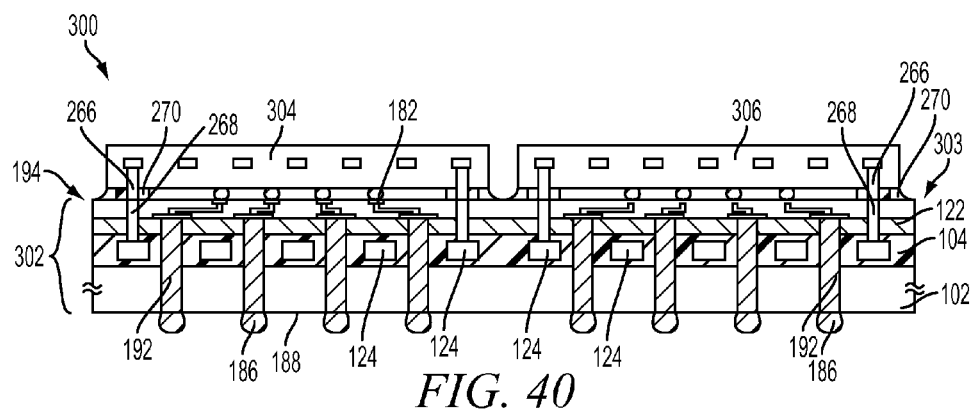
FIG. 40 illustrates another semiconductor structure that includes an interposer similar to that of FIG. 21, and two operational semiconductor devices disposed laterally beside one another and coupled to the interposer, wherein each of the operational semiconductor devices includes fluid microchannels operably coupled with the fluidic microchannels within the interposer by way of vertically extending fluidic interconnects.

In additional embodiments of the present disclosure, two or more semiconductor devices may be structurally and electrically coupled directly to a common interposer having fluidic microchannels as described herein, and the semiconductor devices may be disposed laterally beside one another on the surface of the interposer. As a non-limiting example, FIG. 40 illustrates an example embodiment of a semiconductor structure 300 that includes an interposer 302, a first semiconductor device 304 structurally and electrically coupled directly to the interposer 302, and a second semiconductor device 306 structurally and electrically coupled directly to the interposer 302. The first semiconductor device 304 and the second semiconductor device 306 are located laterally beside one another on the surface of the interposer 302, and are not stacked vertically over one another as in previously described embodiments.

The interposer 302 shown in FIG. 40 is substantially similar to the interposer 180 previously described with reference to FIG. 21, and has a multi-layer body 303 that includes a layer of semiconductor material 122 bonded to a substrate 102 with a layer of dielectric material 104 between the semiconductor material 122 and the substrate 102. Fluidic microchannels 124 extend in lateral directions through the layer of dielectric material 104. In other embodiments, the interposer 302 could include a multi-layer body as described in relation to any of the previously described semiconductor structures, and could include fluidic microchannels extending in lateral directions through the layer of semiconductor material 122, or through both the layer of semiconductor material 122 and the layer of dielectric material 104. The interposer 302 further includes a redistribution layer 194, conductive vias 192, and electrical contacts 182, 186 as previously described herein in relation to the interposer 180 of FIG. 21.

The interposer 302 may comprise a wafer level interposer. Each of the first semiconductor device 304 and the second semiconductor device 306 may comprise, for example, any of the previously mentioned types of semiconductor devices. In some embodiments, the first semiconductor device 304 and the second semiconductor device 306 may be at least substantially identical. In other embodiments, the first semiconductor device 304 and the second semiconductor device 306 may comprise different types of semiconductor devices. As a non-limiting example, the first semiconductor device 304 may comprise an electronic signal processor, and the second semiconductor device 306 may comprise an electronic memory device.

Optionally, the first semiconductor device 304 and/or the second semiconductor device 306 may be similar to the semiconductor device 262 previously described with reference to FIG. 37, and may include fluidic microchannels 264 therein. In some embodiments, the fluidic microchannels 264 in one or both of the semiconductor devices 304, 306 may be coupled with the fluidic microchannels 124 in the interposer 302, as shown in FIG. 40. By way of example and not limitation, vertically extending fluidic interconnects 266 may be formed in the semiconductor devices 304, 306, which may be coupled with fluidic interconnects 268 in the interposer 302 as previously described herein using fluid sealing members 270. In this configuration, fluid caused to flow through the fluidic microchannels 124 may also flow into the fluidic microchannels 264 within the semiconductor device 292 and into the fluidic microchannels 264 within the semiconductor device 294.

In some embodiments, the semiconductor structure 300 may comprise an operational electronic component that may be packaged and sold for integration into electronic systems and devices. In other embodiments, the semiconductor structure 300 may comprise an intermediate structure that may be further processed to fabricate operational electronic components that may be packaged and sold for integration into electronic systems and devices. For example, a plurality of semiconductor structures 260 as illustrated in FIG. 37 may be fabricated by first attaching a plurality of semiconductor devices 304, 306 (two or more) to a wafer level interposer 302 to form the semiconductor structure 300 of FIG. 40. The semiconductor structure 300 then could be diced by sawing, etching, or otherwise cutting through the interposer 302 at designated inactive locations therein between the semiconductor devices 304, 306 to form a plurality of individual semiconductor structures 260 (FIG. 37).

Additional non-limiting example embodiments of the present disclosure are set forth below.

Embodiment 1: An interposer, comprising: a multi-layer body including a semiconductor material bonded to a substrate with a layer of dielectric material between the semiconductor material and the substrate; at least one fluidic microchannel extending in a lateral direction through at least one of the layer of dielectric material and the semiconductor material; at least one redistribution layer on the multi-layer body including at least one laterally extending conductive trace; at least one vertically oriented electrically conductive via extending at least partially through the multi-layer body; at least one electrical contact on a first major surface of the interposer; and at least one electrical contact on a second major surface of the interposer on a side thereof opposite the first major surface; wherein the at least one laterally extending conductive trace and the at least one vertically oriented electrically conductive via at least partially define an electrical pathway extending through the interposer from the at least one electrical contact on the first major surface of the interposer to the at least one electrical contact on the second major surface of the interposer.

Embodiment 2: The interposer of Embodiment 1, wherein the at least one fluidic microchannel includes at least one laterally extending section having a transverse cross-sectional shape entirely surrounded by dielectric material.

Embodiment 3: The interposer of Embodiment 2, wherein the layer of dielectric material comprises a first dielectric material on the substrate and a second dielectric material on the semiconductor material, the semiconductor material being bonded to the substrate by direct dielectric-to-dielectric atomic bonds between the first dielectric material on the substrate and the second dielectric material on the semiconductor material.

Embodiment 4: The interposer of Embodiment 3, wherein the at least one fluidic microchannel is at least partially defined by at least one laterally extending recess in at least one of the first dielectric material and the second dielectric material.

Embodiment 5: The interposer of Embodiment 4, wherein the at least one fluidic microchannel is at least partially defined by a first laterally extending recess in the first dielectric material and a second laterally extending recess in the second dielectric material.

Embodiment 6: The interposer of any one of Embodiments 1 through 5, wherein the layer of dielectric material comprises an oxide.

Embodiment 7: The interposer of Embodiment 6, wherein the oxide comprises silicon oxide.

Embodiment 8: The interposer of any one of Embodiments 1 through 7, wherein the semiconductor material comprises a layer of the semiconductor material having an average layer thickness in a range extending from about ten nanometers (10 nm) to about one and one-half microns (1.5 µm).

Embodiment 9: The interposer of any one of Embodiments 1 through 8, wherein the layer of dielectric material has an average layer thickness in a range extending from about one tenth of a micron (0.1 µm) to about five hundred microns (500 µm).

Embodiment 10: The interposer of any one of Embodiments 1 through 8, further comprising: at least one laterally extending recess in the layer of semiconductor material; another semiconductor material bonded over the layer of semiconductor material; and another dielectric material disposed between the layer of semiconductor material and the another semiconductor material and lining the at least one laterally extending recess in the layer of semiconductor material, the at least one fluidic microchannel extending in a lateral direction through the at least one laterally extending recess in the layer of semiconductor material.

Embodiment 11: The interposer of any one of Embodiments 1 through 10, wherein the semiconductor material comprises silicon.

Embodiment 12: The interposer of any one of Embodiments 1 through 11, further comprising a fluid within the at least one fluidic microchannel.

Embodiment 13: The interposer of Embodiment 12, further comprising a liquid within the at least one fluidic microchannel.

Embodiment 14: A semiconductor structure, comprising: an interposer, and at least one semiconductor device structurally bonded to the interposer. The interposer comprises: a multi-layer body including a semiconductor material bonded to a substrate with a layer of dielectric material between the semiconductor material and the substrate; at least one fluidic microchannel extending in a lateral direction through at least one of the layer of dielectric material and the semiconductor material; at least one redistribution layer on the multi-layer body including at least one laterally extending conductive trace; at least one vertically oriented electrically conductive via extending at least partially through the multi-layer body; at least one electrical contact on a first major surface of the interposer; and at least one electrical contact on a second major surface of the interposer on a side thereof opposite the first major surface; wherein the at least one laterally extending conductive trace and the at least one vertically oriented electrically conductive via at least partially define an electrical pathway extending through the interposer from the at least one electrical contact on the first major surface of the interposer to the at least one electrical contact on the second major surface of the interposer. The at least one semiconductor device structurally bonded to the interposer includes at least one conductive structure structurally and electrically coupled with the at least one electrical contact on the first major surface of the interposer or the at least one electrical contact on the second major surface of the interposer.

Embodiment 15: The semiconductor structure of Embodiment 14, wherein the at least one semiconductor device comprises at least one of an electronic signal processing device, an electronic memory device, and a photoactive device.

Embodiment 16: The semiconductor structure of Embodiment 14 or Embodiment 15, wherein the at least one semiconductor device structurally bonded to the interposer comprises a plurality of semiconductor devices structurally bonded to the interposer.

Embodiment 17: The semiconductor structure of Embodiment 16, wherein a first semiconductor device of the plurality of semiconductor devices comprises an electronic signal processor, and wherein a second semiconductor device of the plurality of semiconductor devices comprises an electronic memory device.

Embodiment 18: A method of fabricating a semiconductor structure including an interposer, comprising: forming a multi-layer body by forming at least one laterally extending recess in at least one of a first dielectric material on a substrate and a second dielectric material on a semiconductor material, and bonding the semiconductor material to the substrate by establishing dielectric-to-dielectric atomic bonds directly between the first dielectric material on the substrate and the second dielectric material on the semiconductor material and defining at least one fluidic microchannel between the first dielectric material and the second dielectric material at an interface between the first dielectric material and the second dielectric material; forming at least one vertically oriented electrically conductive via extending at least partially through the multi-layer body; providing at least one redistribution layer on the multi-layer body including at least one laterally extending conductive trace; providing at least one electrical contact on a first major surface of the interposer; providing at least one electrical contact on a second major surface of the interposer on a side thereof opposite the first major surface; and forming an electrical pathway extending through the interposer from the at least one electrical contact on the first major surface of the interposer to the at least one electrical contact on the second major surface of the interposer, at least a portion of the electrical pathway extending through the at least one vertically oriented electrically conductive via and through the at least one laterally extending conductive trace.

Embodiment 19: The method of Embodiment 18, further comprising forming the at least one laterally extending recess to include at least one laterally extending section having a transverse cross-sectional shape entirely surrounded by the first dielectric material and the second dielectric material.

Embodiment 20: The method of Embodiment 18 or Embodiment 19, further comprising selecting each of the first dielectric material and the second dielectric material to comprise an oxide.

Embodiment 21: The method of Embodiment 20, further comprising selecting each of the first dielectric material and the second dielectric material to comprise silicon oxide.

Embodiment 22: The method of any one of Embodiments 18 through 21, wherein forming the at least one laterally extending recess in at least one of the first dielectric material on the substrate and the second dielectric material on the semiconductor material comprises forming a first laterally extending recess in the first dielectric material and a second laterally extending recess in the second dielectric material, and wherein bonding the semiconductor material to the substrate comprises aligning the first laterally extending recess with the second laterally extending recess such that the at least one fluidic microchannel is at least partially defined by each of the first laterally extending recess and the second laterally extending recess.

Embodiment 23: The method of any one of Embodiments 18 through 22, further comprising selecting the semiconductor material to comprise a layer of semiconductor material having an average layer thickness in a range extending from about ten nanometers (10 nm) to about one and one-half microns (1.5 μm).

Embodiment 24: The method of any one of Embodiments 18 through 23, wherein bonding the semiconductor material to the substrate comprises transferring the layer of semiconductor material from a donor structure to the substrate.

Embodiment 25: The method of Embodiment 24, wherein transferring the layer of semiconductor material from the donor structure to the substrate comprises: implanting ions into the donor structure to form a weakened ion implant plane therein; bonding the donor structure over the substrate; and fracturing the donor structure along the weakened ion implant plane to separate the layer of semiconductor material from a remainder of the donor structure.

Embodiment 26: The method of any one of Embodiments 18 through 25, further comprising: forming at least one laterally extending recess in the layer of semiconductor material; lining the at least one laterally extending recess with a third dielectric material; and bonding another semiconductor material to the layer of semiconductor material by establishing dielectric-to-dielectric atomic bonds directly between the third dielectric material and a fourth dielectric material on the another semiconductor material and defining at least one additional fluidic microchannel between the third dielectric material and the fourth dielectric material at an interface between the third dielectric material and the fourth dielectric material, the at least one additional fluidic microchannel at least partially defined by the at least one laterally extending recess formed in the layer of semiconductor material.

Embodiment 27: The method of Embodiment 26, further comprising forming the at least one additional fluidic microchannel to include at least one laterally extending section having a transverse cross-sectional shape entirely surrounded by the third dielectric material and the fourth dielectric material.

Embodiment 28: The method of any one of Embodiments 18 through 27, further comprising selecting the semiconductor material to comprise silicon.

Embodiment 29: The method of any one of Embodiments 18 through 28, further comprising providing a fluid within the at least one fluidic microchannel.

Embodiment 30: The method of Embodiment 29, further comprising providing a liquid within the at least one fluidic microchannel.

Embodiment 31: The method of any one of Embodiments 18 through 30, further comprising forming at least one vertically extending via hole through the first dielectric material and at least partially through the substrate prior to bonding the semiconductor material to the substrate.

Embodiment 32: The method of Embodiment 31, further comprising providing electrically conductive material within the at least one vertically extending via hole to form the at least one vertically oriented electrically conductive via extending at least partially through the multi-layer body.

Embodiment 33: The method of Embodiment 32, wherein providing electrically conductive material within the at least one vertically extending via hole comprises providing the electrically conductive material within the at least one vertically extending via hole after bonding the semiconductor material to the substrate.

Embodiment 34: The method of Embodiment 32, wherein providing electrically conductive material within the at least one vertically extending via hole comprises providing the electrically conductive material within the at least one vertically extending via hole before bonding the semiconductor material to the substrate.

Embodiment 35: The method of any one of Embodiments 31 through 34, further comprising forming at least one vertically extending additional via hole through the semiconductor material and the second dielectric material and interconnecting the at least one vertically extending additional via hole with the at least one vertically extending via hole extending through the first dielectric material and at least partially through the substrate.

The example embodiments of the disclosure described above do not limit the scope of the invention, since these embodiments are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent to those skilled in the art from the description. Such modifications and embodiments are also intended to fall within the scope of the appended claims.

What is claimed is:

1. A method of fabricating a semiconductor structure including an interposer comprising a semiconductor-on-insulator (SOI) structure, comprising:
    forming an SOI structure including a substrate, a layer of semiconductor material, and dielectric material between the substrate and the layer of semiconductor material, comprising:
        forming at least one laterally extending recess in at least one of a first dielectric material on the substrate and a second dielectric material on a layer of semiconductor material of a donor structure; and
        transferring the layer of semiconductor material from the donor structure to the substrate by establishing dielectric-to-dielectric atomic bonds directly between the first dielectric material on the substrate and the second dielectric material on the semiconductor material and defining at least one fluidic microchannel within the dielectric material of the SOI structure between the first dielectric material and the second dielectric material at an interface between the first dielectric material and the second dielectric material;
    forming at least one vertically oriented electrically conductive via extending at least partially through the SOI structure;
    providing at least one redistribution layer on the SOI structure including at least one laterally extending conductive trace;
    providing at least one electrical contact on a first major surface of the SOI structure;
    providing at least one electrical contact on a second major surface of the SOI structure on a side thereof opposite the first major surface; and
    forming an electrical pathway extending through the SOI structure from the at least one electrical contact on the first major surface of the SOI structure to the at least one electrical contact on the second major surface of the SOI structure, at least a portion of the electrical pathway extending through the at least one vertically oriented electrically conductive via and through the at least one laterally extending conductive trace.

2. The method of claim 1, further comprising forming the at least one laterally extending recess to include at least one laterally extending section having a transverse cross-sectional shape entirely surrounded by the first dielectric material and the second dielectric material.

3. The method of claim 1, further comprising selecting each of the first dielectric material and the second dielectric material to comprise an oxide.

4. The method of claim 3, further comprising selecting each of the first dielectric material and the second dielectric material to comprise silicon oxide.

5. The method of claim 1, wherein forming the at least one laterally extending recess in at least one of the first dielectric material on the substrate and the second dielectric material on the semiconductor material comprises forming a first laterally extending recess in the first dielectric material and a second laterally extending recess in the second dielectric material, and wherein bonding the semiconductor material to the substrate comprises aligning the first laterally extending recess with the second laterally extending recess such that the at least one fluidic microchannel is at least partially defined by each of the first laterally extending recess and the second laterally extending recess.

6. The method of claim 1, further comprising selecting the semiconductor material to comprise a layer of semiconductor material having an average layer thickness in a range extending from about ten nanometers (10 nm) to about one and one-half microns (1.5 μm).

7. The method of claim 1, wherein transferring the layer of semiconductor material from the donor structure to the substrate comprises:
    implanting ions into the donor structure to form a weakened ion implant plane therein;
    bonding the donor structure over the substrate; and
    fracturing the donor structure along the weakened ion implant plane to separate the layer of semiconductor material from a remainder of the donor structure.

8. The method of claim 1, further comprising selecting the semiconductor material to comprise silicon.

9. The method of claim 1, further comprising providing a fluid within the at least one fluidic microchannel.

10. The method of claim 9, further comprising providing a liquid within the at least one fluidic microchannel.

\* \* \* \* \*

UNITED STATES PATENT AND TRADEMARK OFFICE
CERTIFICATE OF CORRECTION

PATENT NO. : 9,245,836 B2  
APPLICATION NO. : 13/536061  
DATED : January 26, 2016  
INVENTOR(S) : Mariam Sadaka Page 1 of 1

It is certified that error appears in the above-identified patent and that said Letters Patent is hereby corrected as shown below:

In the specification:

COLUMN 1, LINE 10, change "Jun. 28,2012, now U.S." to --Jun. 28, 2012, now U.S.--  
COLUMN 13, LINE 2, change "material 124C provided" to --material 122C provided--

Signed and Sealed this  
Twenty-fourth Day of May, 2016

Michelle K. Lee  
*Director of the United States Patent and Trademark Office*